(12) United States Patent
Yamazaki et al.

(10) Patent No.: US 8,871,565 B2
(45) Date of Patent: Oct. 28, 2014

(54) METHOD FOR MANUFACTURING SEMICONDUCTOR DEVICE

(75) Inventors: Shunpei Yamazaki, Setagaya (JP); Yusuke Nonaka, Atsugi (JP); Takayuki Inoue, Isehara (JP); Masashi Tsubuku, Atsugi (JP); Kengo Akimoto, Atsugi (JP); Akiharu Miyanaga, Tochigi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 351 days.

(21) Appl. No.: 13/222,513

(22) Filed: Aug. 31, 2011

(65) Prior Publication Data

US 2012/0064664 A1    Mar. 15, 2012

(30) Foreign Application Priority Data

Sep. 13, 2010   (JP) .................. 2010-204971

(51) Int. Cl.
*H01L 21/44* (2006.01)
*H01L 29/786* (2006.01)

(52) U.S. Cl.
CPC .................. *H01L 29/7869* (2013.01)
USPC .................. 438/104; 257/E21.476

(58) Field of Classification Search
USPC ...................................... 438/104
See application file for complete search history.

(56) References Cited

U.S. PATENT DOCUMENTS

| | | |
|---|---|---|
| 5,528,032 A | 6/1996 | Uchiyama |
| 5,731,856 A | 3/1998 | Kim et al. |
| 5,744,864 A | 4/1998 | Cillessen et al. |
| 6,294,274 B1 | 9/2001 | Kawazoe et al. |
| 6,563,174 B2 | 5/2003 | Kawasaki et al. |

(Continued)

FOREIGN PATENT DOCUMENTS

| | | |
|---|---|---|
| CN | 101728435 | 6/2010 |
| EP | 1737044 A | 12/2006 |

(Continued)

OTHER PUBLICATIONS

Fortunato.E et al., "Wide-Bandgap High-Mobility ZnO Thin-Film Transistors Produced at Room Temperature,", Appl. Phys. Lett. (Applied Physics Letters), Sep. 27, 2003, vol. 85, No. 13, pp. 2541-2543.

(Continued)

*Primary Examiner* — Charles Garber
*Assistant Examiner* — Stanetta Isaac
(74) *Attorney, Agent, or Firm* — Eric J. Robinson; Robinson Intellectual Property Law Office, P.C.

(57) ABSTRACT

An object is to manufacture a semiconductor device including an oxide semiconductor film, which has stable electric characteristics and high reliability. A crystalline oxide semiconductor film is formed, without performing a plurality of steps, as follows: by utilizing a difference in atomic weight of plural kinds of atoms included in an oxide semiconductor target, zinc with low atomic weight is preferentially deposited on an oxide insulating film to form a seed crystal including zinc; and tin, indium, or the like with high atomic weight is deposited on the seed crystal while causing crystal growth. Further, a crystalline oxide semiconductor film is formed by causing crystal growth using a seed crystal with a hexagonal crystal structure including zinc as a nucleus, whereby a single crystal oxide semiconductor film or a substantially single crystal oxide semiconductor film is formed.

10 Claims, 28 Drawing Sheets

(56) References Cited

U.S. PATENT DOCUMENTS

| | | | |
|---|---|---|---|
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0098043 A1* | 4/2009 | Song et al. ............... 423/622 |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2009/0286351 A1* | 11/2009 | Hirao et al. ............... 438/104 |
| 2010/0025679 A1* | 2/2010 | Yamazaki et al. ............ 257/43 |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0109003 A1 | 5/2010 | Akimoto et al. |

FOREIGN PATENT DOCUMENTS

| | | |
|---|---|---|
| EP | 2226847 A | 9/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-026119 | 1/2000 |
| JP | 2000-044236 A | 2/2000 |
| JP | 2000-150900 A | 5/2000 |
| JP | 2002-076356 A | 3/2002 |
| JP | 3298974 B | 7/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2007-096055 A | 4/2007 |
| JP | 2007-123861 A | 5/2007 |
| JP | 2008-108985 A | 5/2008 |
| JP | 2010-135766 A | 6/2010 |
| JP | 2010-177431 | 8/2010 |
| JP | 2010-177431 A | 8/2010 |
| KR | 2010-0048925 A | 5/2010 |
| KR | 2010-0088076 A | 8/2010 |
| WO | WO-2004/114391 | 12/2004 |

OTHER PUBLICATIONS

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

Ikeda.T et al., "Full-Functional System Liquid Crystal Display Using CG-Silicon Technology,", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors,", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment,", Appl. Phys. Lett. (Applied Physics Letters) , Jun. 26, 2007, vol. 90, No. 26, pp. 262106-1-262106-3.

Takahashi.M et al., "Theoretical Analysis of IgZo Transparent Amorphous Oxide Semiconductor,", IDW '08 : Proceedings of the 15th International Display Workshops, Dec. 3, 2008, pp. 1637-1640.

Hayashi.R et al., "42.1: Invited Paper: Improved Amorphous In-Ga-Zn-O TFTs,", SID Digest '08 : SID International Symposium Digest of Technical Papers, May 20, 2008, vol. 39, pp. 621-624.

(56) References Cited

OTHER PUBLICATIONS

Prins.M et al., "A Ferroelectric Transparent Thin-Film Transistor,", Appl. Phys. Lett. (Applied Physics Letters), Jun. 17, 1996, vol. 68, No. 25, pp. 3650-3652.

Nakamura.M et al., "The phase relations in the In2O3-Ga2ZnO4-ZnO system at 1350° C.", Journal of Solid State Chemistry, Aug. 1, 1991, vol. 93, No. 2, pp. 298-315.

Kimizuka.N. et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3-ZnGa2O4-ZnO Systems,", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor,", Science, May 23, 2003, vol. 300, No. 5623, pp. 1269-1272.

Masuda.S et al., "Transparent thin film transistors using ZnO as an active channel layer and their electrical properties,", J. Appl. Phys. (Journal of Applied Physics), Feb. 1, 2003, vol. 93, No. 3, pp. 1624-1630.

Asakuma.N. et al., "Crystallization and Reduction of Sol-Gel-Derived Zinc Oxide Films by Irradiation With Ultraviolet Lamp,", Journal of Sol-Gel Science and Technology, 2003, vol. 26, pp. 181-184.

Osada.T et al., "15.2: Development of Driver-Integrated Panel using Amorphous In-Ga-Zn-Oxide TFT,", SID Digest '09 : SID International Symposium Digest of Technical Papers, May 31, 2009, pp. 184-187.

Nomura.K et al., "Carrier transport in transparent oxide semiconductor with intrinsic structural randomness probed using single-crystalline InGaO3(ZnO)5 films,", Appl. Phys. Lett. (Applied Physics Letters), Sep. 13, 2004, vol. 85, No. 11, pp. 1993-1995.

Li.C et al., "Modulated Structures of Homologous Compounds InMO3(ZnO)m (M=In,Ga; m=Integer) Described by Four-Dimensional Superspace Group,", Journal of Solid State Chemistry, 1998, vol. 139, pp. 347-355.

Son.K et al., "42.4L: Late-News Paper: 4 Inch QVGA Amoled Driven by the Threshold Voltage Controlled Amorphous Gizo (Ga2O3-In2O3-ZnO) TFT,", SID Digest '08 : SID International Symposium Digest of Technical Papers, May 20, 2008, vol. 39, pp. 633-636.

Lee.J et al., "World'S Largest (15-Inch) XGA Amlcd Panel Using IgZo Oxide TFT,", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDs,", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing MOO3 As a Charge-Generation Layer,", Adv. Mater. (Advanced Materials), 2006, vol. 18, No. 3, pp. 339-342.

Tsuda.K et al., "Ultra Low Power Consumption Technologies for Mobile TFT-LCDs ,", IDW '02 : Proceedings of the 9th International Display Workshops, Dec. 4, 2002, pp. 295-298.

Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In-Ga-Zn-O TFTs for Flat Panel Displays,", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA Amoled Display Driven by Indium-Gallium-Zinc Oxide TFTs Array,", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure,", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems,", Journal of Solid-State Circuits , 2008, vol. 43, No. 1, pp. 292-299.

Ohara.H et al., "Amorphous In-Ga-Zn-Oxide TFTs with Suppressed Variation for 4.0 inch QVGA Amoled Display,", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase",", Physics Letters, Sep. 10, 1973, vol. 45A, No. 2, pp. 115-116.

Cho.D et al., "21.2:Al and Sn-Doped Zinc Indium Oxide Thin Film Transistors for Amoled Back-Plane,", SID Digest '09 : SID International Symposium Digest of Technical Papers, May 31, 2009, pp. 280-283.

Lee.M et al., "15.4:Excellent Performance of Indium-Oxide-Based Thin-Film Transistors by DC Sputtering,", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission Amoled Display on Plastic Film and Its Bending Properties,", SID Digest '09 : SID International Symposium Digest of Technical Papers, May 31, 2009, pp. 983-985.

Sakata.J et al., "Development of 4.0-In. Amoled Display With Driver Circuit Using Amorphous In-Ga-Zn-Oxide TFTs,", IDW '09 : Proceedings of the 16th International Display Workshops, 2009, pp. 689-692.

Park.J et al., "Amorphous Indium-Gallium-Zinc Oxide TFTs and Their Application for Large Size Amoled,", AM-FPD '08 Digest of Technical Papers, Jul. 2, 2008, pp. 275-278.

Park.S et al., "Challenge to Future Displays: Transparent AM-OLED Driven by Peald Grown ZnO TFT,", IMID '07 Digest, 2007, pp. 1249-1252.

Godo.H et al., "Temperature Dependence of Characteristics and Electronic Structure for Amorphous In-Ga-Zn-Oxide TFT,", AM-FPD '09 Digest of Technical Papers, Jul. 1, 2009, pp. 41-44.

Osada.T et al., "Development of Driver-Integrated Panel Using Amorphous In-Ga-Zn-Oxide TFT,", AM-FPD '09 Digest of Technical Papers, Jul. 1, 2009, pp. 33-36.

Hirao.T et al., "Novel Top-Gate Zinc Oxide Thin-Film Transistors (ZnO TFTs) for AMLCDS,", Journal of the SID, 2007, vol. 15, No. 1, pp. 17-22.

Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In-Ga-Zn-Oxide TFT,", SID Digest '09 : SID International Symposium Digest of Technical Papers, May 31, 2009, pp. 1110-1112.

Ohara.H et al., "21.3:4.0 In. QVGA Amoled Display Using In-Ga-Zn-Oxide TFTs With a Novel Passivation Layer,", SID Digest '09 : SID International Symposium Digest of Technical Papers, May 31, 2009, pp. 284-287.

Miyasaka.M, "Suftla Flexible Microelectronics on Their Way to Business,", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications,", SID Digest '09 : SID International Symposium Digest of Technical Papers, May 31, 2009, pp. 578-581.

Asaoka.Y et al., "29.1: Polarizer-Free Reflective LCD Combined With Ultra Low-Power Driving Technology,", SID Digest '09 : SID International Symposium Digest of Technical Papers, May 31, 2009, pp. 395-398.

Lee.H et al., "Current Status of, Challenges to, and Perspective View of AM-OLED ,", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display

(56) References Cited

OTHER PUBLICATIONS

Application,", SID Digest '07 : SID International Symposium Digest of Technical Papers, 2007, vol. 38, pp. 1737-1740.

Nakamura.M, "Synthesis of Homologous Compound with New Long-Period Structure,", NIRIM Newsletter, Mar. 1, 1995, vol. 150, pp. 1-4.

Kikuchi.H et al., "Polymer-Stabilized Liquid Crystal Blue Phases,", Nature Materials, Sep. 1, 2002, vol. 1, pp. 64-68.

Kimizuka.N. et al., "Spinel,YBFE2O4, and YB2FE3O7 Types of Structures for Compounds in the IN2O3 and SC2O3-A2O3-Bo Systems [A; Fe, Ga, or Al; B: Mg, Mn, Fe, Ni, Cu,or Zn] At Temperatures Over 1000° C.,", Journal of Solid State Chemistry, 1985, vol. 60, pp. 382-384.

Kitzerow.H et al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and Its Blue Phase,", Phys. Rev. A (Physical Review. A), May 1, 1984, vol. 29, No. 5, pp. 2957-2959.

Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.

Orita.M et al., "Mechanism of Electrical Conductivity of Transparent InGaZnO4,", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", Jpn. J. Appl. Phys. (Japanese Journal of Applied Physics) , 2006, vol. 45, No. 5B, pp. 4303-4308.

Janotti.A et al., "Native Point Defects in ZnO,", Phys. Rev. B (Physical Review. B), Oct. 4, 2007, vol. 76, No. 16, pp. 165202-1-165202-22.

Park.J et al., "Electronic Transport Properties of Amorphous Indium-Gallium-Zinc Oxide Semiconductor Upon Exposure to Water,", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.

Janotti.A et al., "Oxygen Vacancies in ZnO,", Appl. Phys. Lett. (Applied Physics Letters) , 2005, vol. 87, pp. 122102-1-122102-3.

Oba.F et al., "Defect energetics in ZnO: A hybrid Hartree-Fock density functional study,", Phys. Rev. B (Physical Review. B), 2008, vol. 77, pp. 245202-1-245202-6.

Orita.M et al., "Amorphous transparent conductive oxide InGaO3(ZnO)m (m<4):a Zn4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW '08 : Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317, ECS.

Clark.S et al., "First Principles Methods Using CASTEP,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers,", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator,", Appl. Phys. Lett. (Applied Physics Letters) , Sep. 1, 2003, vol. 83, No. 9, pp. 1755-1757.

Kamiya et al., "Carrier transport properties and electronic structures of amorphous oxide semiconductors: the present status", Solid State Physics, vol. 44, No. 9, 2009, pp. 621-633.

International Search Report (Application No. PCT/JP2011/070668), Dated Nov. 22, 2011.

Written Opinion (Application No. PCT/JP2011/070668), Dated Nov. 22, 2011.

\* cited by examiner

Zn     O

METHOD FOR MANUFACTURING SEMICONDUCTOR DEVICE

TECHNICAL FIELD

An embodiment of the present invention relates to a semiconductor device which includes a circuit including at least a semiconductor element such as a transistor as an element, and a manufacturing method thereof. For example, embodiments of the present invention relate to an electronic device which includes, as a component, any of a power device mounted in a power circuit, a semiconductor integrated circuit including a memory, a thyristor, a converter, an image sensor, or the like, an electro-optical device typified by a liquid crystal display device, and a light-emitting display device including a light-emitting element.

Note that the semiconductor device in this specification refers to all devices that can function by utilizing semiconductor characteristics, and electro-optic devices, semiconductor circuits, and electronic appliances are all semiconductor devices.

BACKGROUND ART

Transistors formed over a glass substrate or the like are typically manufactured using amorphous silicon, polycrystalline silicon, or the like, as typically seen in liquid crystal display devices. Although transistors including amorphous silicon have low field effect mobility, they can be formed over larger glass substrates. On the other hand, although a transistor manufactured using polycrystalline silicon has high field-effect mobility, it has a disadvantage of not being suitable for a larger glass substrate.

In view of the foregoing, attention has been drawn to a technique by which a transistor is manufactured using an oxide semiconductor, and such a transistor is applied to an electronic appliance or an optical device. For example, Patent Document 1 and Patent Document 2 disclose a technique in which a transistor is manufactured using zinc oxide or an In—Ga—Zn—O-based oxide as an oxide semiconductor and such a transistor is used as a switching element or the like of a pixel of a display device.

As for an oxide semiconductor used in such a transistor, there is description as follows: an oxide semiconductor is insensitive to impurities; there is no problem when a considerable amount of metal impurities is contained in the film; and, soda-lime glass which contains a large amount of alkali metal such as sodium and is inexpensive can also be used (see Non-Patent Document 1).

REFERENCE

[Patent Document 1] Japanese Published Patent Application No. 2007-123861
[Patent Document 2] Japanese Published Patent Application No. 2007-096055

Non-Patent Document

[Non-Patent Document 1] Kamiya, Nomura, and Hosono, "Carrier Transport Properties and Electronic Structures of Amorphous Oxide Semiconductors: The present status", KOTAI BUTSURI (SOLID STATE PHYSICS), 2009, Vol. 44, pp. 621-633

DISCLOSURE OF INVENTION

When hydrogen or moisture, which is to be a source for supplying a carrier enters the oxide semiconductor in a process for manufacturing a device, the electrical conductivity of the oxide semiconductor may change. Such a phenomenon causes variation in the electric characteristics of a transistor using the oxide semiconductor.

Further, the electric characteristics of a semiconductor device using an oxide semiconductor could possibly change by irradiation with visible light or ultraviolet light.

In view of the above problems, one object is to provide a semiconductor device including an oxide semiconductor film, which has stable electric characteristics and high reliability.

Further, another object is to provide a manufacturing process of a semiconductor device, which enables mass production of highly reliable semiconductor devices by using a large-sized substrate such as a mother glass.

A main point of one embodiment of the present invention is to form a crystalline oxide semiconductor film, without performing a plurality of steps, in one sputtering step in the following manner. By utilizing a difference in atomic weight of plural kinds of atoms included in a target for an oxide semiconductor, zinc whose atomic weight is low is preferentially deposited over an oxide insulating film so that a seed crystal with a hexagonal crystal structure including zinc is formed at least on a surface of a film which is being formed; and tin, indium, or the like whose atomic weight is high is deposited on the seed crystal while causing crystal growth. Note that the seed crystal including zinc is not only formed on the surface of the film being formed, and may be formed in an interface with the oxide insulating film. Further, a crystalline oxide semiconductor film is formed by causing crystal growth using the seed crystal with a hexagonal crystal structure including zinc as a nucleus, so that a single crystal oxide semiconductor film or a substantially single crystal oxide semiconductor film which is another main point of one embodiment of the present invention is formed.

Further, another main point of one embodiment of the present invention is to form a transistor using a crystalline oxide semiconductor film with a hexagonal crystal structure. The crystalline oxide semiconductor film is formed in the following manner. A seed crystal with a hexagonal crystal structure including zinc is formed by a sputtering method over an oxide insulating film which is formed over a substrate, and crystal growth is caused using the seed crystal as a nucleus.

The crystalline oxide semiconductor film is formed by a sputtering method while a first heat treatment is performed at higher than or equal to 250° C. and lower than or equal to 350° C. in an oxygen atmosphere. Thus, the first heat treatment is performed in a treatment chamber. In a sputtering apparatus used for the deposition, a distance between a target and a substance is set to a distance which enables an element with low atomic weight to reach a surface of the substrate preferentially. As a result, zinc is preferentially deposited on an oxide insulating film, and the deposited zinc is oxidized, whereby a seed crystal with a hexagonal crystal structure including zinc, typically a seed crystal with a hexagonal crystal structure including zinc oxide is formed. Therefore, the seed crystal which has grown from a surface of the oxide insulating film can be formed. Further, by continuously performing sputtering, crystal growth is caused using the seed crystal with a hexagonal crystal structure including zinc as a nucleus, so that a crystalline oxide semiconductor film having a hexagonal crystal structure can be formed. In such a crystalline oxide semiconductor film having a hexagonal crystal structure, bonds for forming hexagonal lattices are formed in the a-b plane parallel to a substrate surface where a film is formed, and c-axes are substantially perpendicular to a plane surface of the substrate which is substantially parallel to the a-b plane.

Orderliness of the crystal structure is high in the crystalline oxide semiconductor film having a hexagonal crystal structure where bonds for forming hexagonal lattices are formed in the a-b plane and c-axes are perpendicular to the plane surface of the substrate. FIG. 17 is a plan TEM image of this crystalline oxide semiconductor film. FIG. 18 shows part of the enlarged image of FIG. 17, in which atoms are surrounded by white lines for easy understanding of a hexagonal lattice. A transistor including such a crystalline oxide semiconductor film has stable electric characteristics and high reliability.

One reason for high reliability of a transistor including a crystalline oxide semiconductor film will be described below.

A crystalline oxide semiconductor has higher orderliness of a bond between metal and oxygen (-M-O-M-, where O represents an oxygen atom and M represents a metal atom) than an amorphous oxide semiconductor. In other words, in the case where an oxide semiconductor has an amorphous structure, the coordination number may vary according to the kind of metal atoms. In contrast, in the case of a crystalline oxide semiconductor, the coordination number is substantially uniform. Accordingly, microscopic oxygen vacancies can be reduced, and instability and charge transfer due to attachment or detachment of a hydrogen atom (including a hydrogen ion) or an alkali metal atom in a "space" described later can be reduced.

On the other hand, in the case of an amorphous structure, since the coordination number varies according to the kind of metal atoms, the concentration of metal atoms or oxygen atoms may be microscopically uneven and there may be some portions where no atom exists ("space"). In such a "space", for example, a hydrogen atom (including a hydrogen ion) or an alkali metal atom is trapped and, in some cases, bonded to oxygen. Further, it is possible for those atoms to move through such a "space".

Such movement of an atom may cause variation in characteristics of an oxide semiconductor, and thus the existence of such an atom leads to a significant problem in reliability. In particular, such movement of an atom is caused by application of a high electric field or light energy; therefore, when an oxide semiconductor is used under such a condition, characteristics thereof are unstable. That is, the reliability of an amorphous oxide semiconductor is inferior to that of a crystalline oxide semiconductor.

Hereinafter, a difference in reliability will be described using actually obtained results on transistors (Sample 1 and Sample 2). Note that Sample 2 that is actually obtained and described below includes a crystalline oxide semiconductor film obtained by forming a first material film at a film formation temperature of 200° C. and then performing heating at 450° C. in a nitrogen atmosphere and by forming a second material film at a film formation temperature of 200° C. and then performing heating at 450° C. in a dry air atmosphere. Sample 2 includes the crystalline oxide semiconductor film including the first and second material films of the same material; it is needless to say that the same applies even when the first and second material films include different materials. Sample 1 that is used for comparison includes a crystalline oxide semiconductor film obtained by heating a single-layer material film by RTA at 650° C. and then performing heating at 450° C. in a dry air atmosphere.

As a method for examining the reliability, an Id-Vg curve of a transistor is measured, which is obtained by measuring the current (Id) between a drain electrode and a source electrode of the transistor when the voltage (Vg) between a gate electrode and the source electrode of the transistor is changed while the transistor is being irradiated with light. In a transistor including an oxide semiconductor film, when a -BT test is performed, i.e., when a negative gate stress is applied, while the transistor is being irradiated with light, degradation in which the threshold voltage of the transistor is changed is caused. This degradation is also referred to as negative-bias temperature stress photo-degradation.

Negative-bias temperature stress photo-degradation in Samples 1 and 2 is shown in FIG. 19.

In FIG. 19, the amount of change in Vth in Sample 2 is smaller than that in Sample 1.

Then, photo-response characteristics of the transistor of Sample 1 (L/W=3 μm/50 μm) before and after it is irradiated with light (wave length: 400 nm, irradiation intensity: 3.5 mW/cm$^2$) for 600 seconds were measured. FIG. 20A is the graph of photo-response characteristics (a graph of time dependence of photocurrent) which is made on the basis of the measurement results. Note that the source-drain voltage (Vd) is 0.1 V.

Further, photo-response characteristics of the transistor of Sample 2 (L/W=3 μm/50 μm) before and after it is irradiated with light (wave length: 400 nm, irradiation intensity: 3.5 mW/cm$^2$) for 600 seconds were measured. FIG. 20B is the graph of photo-response characteristics (a graph of time dependence of photocurrent) which is made on the basis of the measurement results.

Further, measurement was performed on a transistor which was formed under the same manufacturing condition as Sample 2 and had a larger W width (L/W=30 μm/10000 μm) and a transistor which was formed under the same manufacturing condition as Sample 2, had the larger W width, and was supplied with higher Vd (Vd=15V). Then, fitting was performed on the measurement results, so that two kinds of relaxation time ($\tau$1 and $\tau$2) were obtained. The calculation results thereof and the maximum current value (Imax) are shown in Table 1.

TABLE 1

|  | Imax [A] | $\tau_1$ [sec] | $\tau_2$ [sec] |
| --- | --- | --- | --- |
| Sample 1: L/W = 3/50, Vd = 0.1 V | 4.60E−11 | 2.6 | 90 |
| Sample 2: L/W = 3/50, Vd = 0.1 V | 9.20E−12 | 0.4 | 43 |
| L/W = 30/100000 μm, Vd = 0.1 V | 6.20E−11 | 0.3 | 39 |
| L/W = 30/100000 μm, Vd = 15 V | 9.20E−10 | 0.4 | 75 |

Note that the two kinds of relaxation time ($\tau$1 and $\tau$2) depend on the trap density. A method for calculating $\tau$1 and $\tau$2 is referred to as a photo-response defect evaluation method.

Table 1 shows that each of the transistors formed under the manufacturing condition of Sample 2, in which negative-bias temperature stress photo-degradation is small, has higher photo-response characteristics than Sample 1. Accordingly, it can be found that higher photo-response characteristics are obtained as negative-bias temperature stress photo-degradation is smaller.

One reason for that will be described. If there exists a deep donor level and a hole is trapped by the donor level, the hole might become fixed charge by a negative bias applied to a gate in negative-bias temperature stress photo-degradation and the relaxation time of a current value might be increased in photo-response. A reason why a transistor including a crystalline oxide semiconductor film has small negative-bias temperature stress photo-degradation and high photo-response characteristics is thought to be attributed to low density of the above donor level that traps a hole. FIG. 21 is a schematic diagram of an assumed donor level.

In order to examine changes in the depth and density of the donor level, measurement using low-temperature PL was performed. FIG. 22 shows measurement results in the case where the substrate temperature in formation of an oxide semiconductor film is 400° C. and in the case where the substrate temperature in formation of an oxide semiconductor film is 200° C.

According to FIG. 22, when the substrate temperature in formation of the oxide semiconductor film is 400° C., the peak intensity in the vicinity of about 1.8 eV is much lower than that in the case where the substrate temperature is 200° C. The measurement results indicate that the density of the donor level is significantly reduced while the depth thereof is not changed.

Oxide semiconductor films were formed under varied conditions of the substrate temperature, were compared to each other, and were each evaluated as a single film.

Sample A has a structure in which a 50-nm-thick oxide semiconductor film is formed over a quartz substrate (thickness: 0.5 mm). Note that the oxide semiconductor film is formed under the following condition: a target for an oxide semiconductor (a target for an In—Ga—Zn—O-based oxide semiconductor ($In_2O_3:Ga_2O_3:ZnO=1:1:2$ [molar ratio])) is used; the distance between the substrate and the target is 60 mm; the substrate temperature is 200° C.; the pressure is 0.4 Pa; the direct current (DC) power is 0.5 kW; and the atmosphere is a mixed atmosphere of argon (30 sccm) and oxygen (15 sccm).

The electron spin resonance (ESR) is measured at room temperature (300 K). Then, a value of a magnetic field ($H_0$) where a microwave (frequency: 9.5 GHz) is absorbed is used for an equation $g=h\gamma/\beta H_0$, so that a parameter of a g-factor is obtained. Note that h and β represent the Planck constant and the Bohr magneton, respectively, and are both constants.

FIG. 23A is a graph showing the g-factor of Sample A.

Sample B is formed in such a manner that deposition is performed under the same condition as Sample A and then heating is performed at 450° C. for 1 hour in a nitrogen atmosphere. FIG. 23B is a graph showing the g-factor of Sample B.

Sample C is formed in such a manner that deposition is performed under the same condition as Sample A and then heating is performed at 450° C. for 1 hour in a mixed atmosphere of nitrogen and oxygen. FIG. 23C is a graph showing the g-factor of Sample C.

In the graph of the g-factor of Sample B, a signal which is g=1.93 can be observed and the spin density is $1.8\times10^{18}$ [spins/cm$^3$]. On the other hand, the signal of g=1.93 cannot be observed in the result of ESR measurement of Sample C, and thus the signal g=1.93 is attributed to a dangling bond of metal in the oxide semiconductor film.

In addition, Samples D, E, F, and G each have a structure in which a 100-nm-thick oxide semiconductor film is formed over a quartz substrate (thickness: 0.5 mm). Note that the oxide semiconductor film is formed under the following condition: a target for an oxide semiconductor (a target for an In—Ga—Zn—O-based oxide semiconductor ($In_2O_3:Ga_2O_3:ZnO=1:1:2$ [molar ratio])) is used; the distance between the substrate and the target is 60 mm; the pressure is 0.4 Pa; the direct current (DC) power is 0.5 kW; and the atmosphere is a mixed atmosphere of argon (30 sccm) and oxygen (15 sccm). Samples D, E, F, and G are formed at different substrate temperatures: room temperature for Sample D, 200° C. for Sample E, 300° C. for Sample F, and 400° C. for Sample G. FIG. 24 shows ESR spectra of Samples D, E, F, and G.

In Sample G whose substrate temperature in deposition (Tsub) is 400° C., the signal g=1.93 can be observed and the spin density is $1.3\times10^{18}$ [spins/cm$^3$]. The spin density is the same level as the spin density of the signal g=1.93 obtained in Sample B.

FIG. 25 is a graph of ESR measurement result of Sample B and shows a difference (anisotropy) in the g-factor between the case where a magnetic field is applied perpendicularly to a substrate surface (a spectrum represented by a solid line) and the case where a magnetic field is applied in parallel to the substrate surface (a spectrum represented by a dashed line).

FIG. 26 is a graph of ESR measurement result of Sample H which is formed in such a manner that deposition is performed under the same condition as Sample G and then heating is performed at 450° C. for 1 hour in a nitrogen atmosphere, and shows a difference (anisotropy) in the g-factor between the case where a magnetic field is applied perpendicularly to a substrate surface (a spectrum represented by a solid line) and the case where a magnetic field is applied in parallel to the substrate surface (a spectrum represented by a dashed line).

As a result of comparison between FIG. 25 and FIG. 26, it is found that the change Δg in the g-factor due to anisotropy is 0.001 or lower at a substrate temperature of 200° C. whereas the change Δg is increased to approximately 0.003 at a substrate temperature of 400° C. It is generally known that the anisotropy is increased as the crystallinity becomes higher (directions of orbits are more aligned). Thus, a conclusion is led that in a film formed at a substrate temperature of 400° C., the directions of dangling bonds of metal generated by heating at 450° C. for 1 hour in a nitrogen atmosphere are well aligned as compared to those in a film formed at a substrate temperature of 200° C.; that is, the former has higher crystallinity than the latter.

Further, ESR measurement was performed under varied conditions of the thickness of an oxide semiconductor film. Change in the intensity of the signal g=1.93 and total spin number are shown in FIG. 27 and FIG. 28, respectively. From the results in FIG. 27 and FIG. 28, it is confirmed that the intensity of the signal g=1.93 is increased as the thickness of the oxide semiconductor film is increased. This indicates that a dangling bond that causes the signal g=1.93 exists not at an interface between the quartz substrate and the oxide semiconductor film or a surface of the oxide semiconductor film but in a bulk of the oxide semiconductor film.

It is found from these results that a dangling bond of metal has anisotropy and that the anisotropy is increased as the deposition temperature gets higher because higher crystallinity is obtained at higher deposition temperature. In addition, it is found that the dangling bond of metal exists not at the interface or surface but in the bulk.

From the above results, an increase in anisotropy of the g-factor, which is considered to be caused by improvement in crystallinity, was observed as the substrate temperature in deposition is increased. Further, the results indicates that the dangling bond that causes the signal g=1.93 dependents on the film thickness and exists in a bulk of IGZO.

Note that the oxide insulating film in contact with the crystalline oxide semiconductor film is preferably formed using an oxide insulating film from which some amount of oxygen is released by heat treatment. The oxide insulating film from which part of contained oxygen is released by heat treatment is preferably an oxide insulating film which contains oxygen exceeding the stoichiometry. A second heat treatment is performed after the crystalline oxide semiconductor film is formed, whereby oxygen in the oxide insulating film diffuses to the inside of the crystalline oxide semiconductor film or an interface between the oxide insulating film and the crystalline oxide semiconductor film; thus, oxygen deficiency in the crystalline oxide semiconductor film can be reduced. The second heat treatment is performed at a temperature higher than or equal to 150° C. and lower than the strain point of the substrate, preferably higher than or equal to 250° C. and lower than or equal to 450° C.

In addition, the pressure of a treatment chamber in a sputtering apparatus is set to 0.4 Pa or less, whereby entry of impurities such as alkali metal or hydrogen to an object to be formed or a surface of the object to be formed can be suppressed. Note that hydrogen contained in the object includes a hydrogen molecule, water, a hydroxyl group, or a hydride in some cases in addition to a hydrogen atom.

A distance between a target and a substrate (a T-S distance) is greater than or equal to 40 mm and less than or equal to 300 mm (preferably, greater than or equal to 60 mm). As the T-S distance is increased, zinc with the lowest atomic weight in the metal elements contained in the sputtering target for an oxide semiconductor is more easily deposited on the substrate side than the other elements with larger atomic weight than zinc, and bonds for forming hexagonal lattices are formed. Thus, the long T-S distance is preferable.

During deposition by a sputtering method, the temperature of the surface where a film is formed is preferably higher than or equal to 250° C. and lower than or equal to the upper limit of heat treatment of the substrate. The temperature at which entry of impurities such as water or hydrogen into a film to be formed is prevented and the impurity is released to a vapor phase in the chamber is 250° C. In addition, the upper limit of a temperature of the surface where a film is formed by a sputtering method is the upper limit of the heat treatment temperature of the substrate or the upper limit of the temperature of the film to be formed (if the temperature exceeds the latter upper limit, components in the film significantly change).

Moreover, when the leakage rate of the treatment chamber of the sputtering apparatus is set to lower than or equal to $1 \times 10^{-10}$ Pa·m$^3$/sec., entry of impurities such as an alkali metal or a hydride into the crystalline oxide semiconductor film that is being formed by a sputtering method can be reduced. Further, with use of an entrapment vacuum pump as an evacuation system, counter flow of impurities such as an alkali metal, a hydrogen atom, a hydrogen molecule, water, a hydroxyl group, or a hydride from the evacuation system can be reduced.

When the purity of the target is set to 99.99% or higher, alkali metal, a hydrogen atom, a hydrogen molecule, water, a hydroxyl group, a hydride, or the like entering the crystalline oxide semiconductor film can be reduced. In addition, when the target is used, the concentration of alkali metal such as lithium, sodium, or potassium can be reduced in the crystalline oxide semiconductor film.

Under the above deposition conditions, a crystalline oxide semiconductor film is formed. As a result, purification of materials is performed during deposition, and accordingly the crystalline oxide semiconductor film including an extremely small amount of impurities in which the concentration of alkali metal is lower than or equal to $5 \times 10^{16}$ atoms/cm$^3$ and the concentration of hydrogen is lower than or equal to $1 \times 10^{19}$ atoms/cm$^3$ can be formed. By reduction of impurities in the crystalline oxide semiconductor film, crystal growth of a seed crystal and the crystalline oxide semiconductor film are further promoted, so that a single crystal oxide semiconductor film or a substantially single crystal oxide semiconductor film can be formed.

As a structure of a transistor, a top-gate transistor or a bottom-gate transistor can be employed as appropriate. In the case where a top-gate transistor is manufactured, the top-gate transistor is formed as follows: over an oxide insulating film formed over an insulating surface, a crystalline oxide semiconductor film having a hexagonal crystal structure is formed by a sputtering method in which a seed crystal with a hexagonal crystal structure including zinc is formed and crystal growth is caused using the seed crystal as nucleus; a heat treatment is performed on the crystal oxide semiconductor film; the crystalline oxide semiconductor which has been subjected to the heat treatment is then selectively etched; a pair of electrodes is formed over the selectively etched crystalline oxide semiconductor film; a gate insulating film is formed over the selectively etched crystalline oxide semiconductor film and the pair of electrodes; and a gate electrode is formed over the gate insulating film. In the case where a bottom-gate transistor is manufactured, the bottom-gate transistor is formed as follows: a gate electrode is formed over an insulating surface; a gate insulating film comprising an oxide insulating film is formed over the gate electrode; a crystalline oxide semiconductor film having a hexagonal crystal structure is formed over the gate insulating film by a sputtering method in which a seed crystal with a hexagonal crystal structure including zinc is formed and crystal growth is caused using the seed crystal as a nucleus; a heat treatment is performed on the crystalline oxide semiconductor film; the crystalline oxide semiconductor which has been subjected to the heat treatment is then selectively etched; and a pair of electrodes is formed over the selectively etched crystalline oxide semiconductor film.

A transistor, in which a channel region is included in a crystalline oxide semiconductor film having a hexagonal crystal structure where bonds for forming hexagonal lattices are formed in the a-b plane and c-axes are substantially perpendicular to a plan surface of a substrate which is substantially parallel to the a-b plane, is manufactured, whereby the amount of change in the threshold voltage of the transistor between before and after performance of a bias-thermal stress (BT) test or light irradiation of the transistor can be reduced. Thus, the transistor can have stable electric characteristics. Further, by setting a temperature of the first heat treatment and the second heat treatment to lower than or equal to 450° C., mass production of highly reliable semiconductor devices can be performed with use of a large-sized substrate such as mother glass.

BEST MODE FOR CARRYING OUT THE INVENTION

Figure 1A:
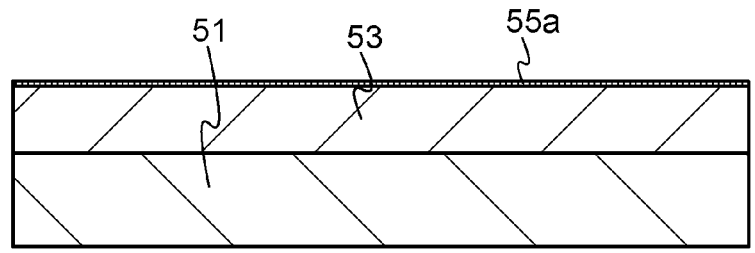
FIGS. 1A to 1E are cross-sectional views illustrating a method for manufacturing a semiconductor device according to one embodiment of the present invention.

Hereinafter, embodiments of the present invention will be described in detail with reference to the accompanying drawings. Note that the present invention is not limited to the following description, and it will be easily understood by those skilled in the art that various changes and modifications can be made without departing from the spirit and scope of the invention. Therefore, the invention should not be construed as being limited to the description in the following embodiments. Note that in structures of the present invention described hereinafter, like portions or portions having similar functions are denoted by the same reference numerals in different drawings, and description thereof is not repeated.

Note that in each drawing described in this specification, the size, the layer thickness, or the region of each component is exaggerated for clarity in some cases. Therefore, embodiments of the present invention are not limited to such scales.

Note that terms such as "first", "second", and "third" in this specification are used in order to avoid confusion among components, and the terms do not limit the components numerically. Therefore, for example, the term "first" can be replaced with the term "second", "third", or the like as appropriate.

Embodiment 1

In this embodiment, a method for manufacturing a crystalline oxide semiconductor and a method for manufacturing a transistor including the crystalline oxide semiconductor will be described with reference to FIGS. 1A to 1E and FIG. 2. FIGS. 1A to 1E are cross-sectional views illustrating a manufacturing process of a transistor as one mode of a structure of a semiconductor device. The cross-sectional view taken along the dot-dash line A-B in FIG. 2 corresponds to FIG. 1E. In this embodiment, the transistor having a top gate structure is described.

As illustrated in FIG. 1A, an oxide insulating film 53 is formed over a substrate 51.

The substrate 51 should have at least heat resistance high enough to withstand heat treatment performed later. When a glass substrate is used as the substrate 51, a glass substrate whose strain point is higher than or equal to 730° C. is preferably used. As the glass substrate, for example, a glass material such as aluminosilicate glass, aluminoborosilicate glass, or barium borosilicate glass is used. Note that a glass substrate containing BaO and $B_2O_3$ so that the amount of BaO is larger than that of $B_2O_3$ is preferably used. In the case where the substrate 51 is mother glass, the substrate may have any of the following sizes: the first generation (320 mm×400 mm), the second generation (400 mm×500 mm), the third generation (550 mm×650 mm), the fourth generation (680 mm×880 mm or 730 mm×920 mm), the fifth generation (1000 mm×1200 mm or 1100 mm×1250 mm), the sixth generation (1500 mm×1800 mm), the seventh generation (1900 mm×2200 mm), the eighth generation (2160 mm×2460 mm), the ninth generation (2400 mm×2800 mm or 2450 mm×3050 mm), the tenth generation (2950 mm×3400 mm), and the like. The mother glass drastically shrinks when the treatment temperature is high and the treatment time is long. Thus, in the case where mass production is performed with use of the mother glass, the preferable heating temperature in the manufacturing process is lower than or equal to 600° C., further preferably, lower than or equal to 450° C.

Instead of the glass substrate, a substrate formed of an insulator, such as a ceramic substrate, a quartz substrate, or a sapphire substrate can be used. Alternatively, crystallized glass or the like may be used. Further alternatively, a substrate obtained by forming an insulating film over a surface of a semiconductor substrate such as a silicon wafer or a conductive substrate made of a metal material can be used.

The oxide insulating film 53 is formed using an oxide insulating film from which part of contained oxygen is released by heat treatment. The oxide insulating film from which part of contained oxygen is released by heat treatment is preferably an oxide insulating film which contains oxygen exceeding the stoichiometry. The oxide insulating film from which part of contained oxygen is released by heat treatment can diffuse oxygen into the crystalline oxide semiconductor film by heat treatment. Typical examples of the oxide insulating film 53 include films of silicon oxide, silicon oxynitride, silicon nitride oxide, aluminum oxide, aluminum oxynitride, gallium oxide, hafnium oxide, yttrium oxide, and the like.

The oxide insulating film having higher proportion of oxygen than that of the stoichiometry releases part of contained oxygen by heat treatment. To release oxygen by heating means that the released amount of oxygen which is converted to oxygen atoms is greater than or equal to $1\times10^{18}$ atoms/cm$^3$, preferably greater than or equal to $1\times10^{20}$ atoms/cm$^3$, further preferably greater than or equal to $3\times10^{20}$ atoms/cm$^3$ in thermal desorption spectroscopy (TDS).

Here, a method in which the amount of released oxygen is measured by being converted into oxygen atoms using TDS analysis will now be described.

The amount of released gas in TDS analysis is proportional to the integral value of a spectrum. Therefore, the amount of released gas can be calculated from the ratio between the integral value of a spectrum of an oxide insulating film and the reference value of a standard sample. The reference value of a standard sample refers to the ratio of the density of a predetermined atom contained in a sample to the integral value of a spectrum.

For example, the number of the released oxygen molecules ($N_{(O2)}$) from an oxide insulating film can be found according to a Numerical Expression 1 with the TDS analysis results of a silicon wafer containing hydrogen at a predetermined density which is the standard sample and the TDS analysis results of the oxide insulating film. Here, all spectra having a mass number of 32 which are obtained by the TDS analysis are assumed to originate from an oxygen molecule. CH$_3$OH, which is given as a gas having a mass number of 32, is not taken into consideration on the assumption that it is unlikely to be present. Further, an oxygen molecule including an oxygen atom having a mass number of 17 or 18 which is an isotope of an oxygen atom is also not taken into consideration because the proportion of such a molecule in the natural world is minimal.

$$N_{(O2)}=N_{(H2)}/S_{(H2)}\times S_{(O2)}\times \alpha \qquad \text{(Numerical Expression 1)}$$

$N_{(H2)}$ is the value obtained by conversion of the number of hydrogen molecules released from the standard sample into densities. $S_{(H2)}$ is an integral value of spectrum of a standard sample which is analyzed by TDS. Here, the reference value of the standard sample is set to $N_{(H2)}/S_{(H2)}$. $S_{(O2)}$ is an integral value of spectrum when the oxide insulating film is analyzed by TDS. α is a coefficient which influences spectrum intensity in TDS analysis. The detail of Numerical Expression 1 is referred to Japanese Patent No. 3298974. Note that the amount of released oxygen from the above oxide insulating film is measured with a thermal desorption spectroscopy apparatus produced by ESCO Ltd., EMD-WA1000S/W using a silicon wafer containing hydrogen atoms at $1\times10^{16}$ atoms/cm$^3$ as the standard sample.

Further, in the TDS analysis, some amount of oxygen is detected as an oxygen atom. The ratio between oxygen molecules and oxygen atoms can be calculated from the ionization rate of the oxygen molecules. Note that, since the above α includes the ionization rate of the oxygen molecules, the number of the released oxygen atoms can also be estimated through the evaluation of the number of the released oxygen molecules.

Note that $N_{(O2)}$ is the number of the released oxygen molecules. For the oxide insulating film, the amount of released oxygen when converted into oxygen atoms is twice the number of the released oxygen molecules.

The oxide insulating film 53 has a thickness greater than or equal to 50 nm, preferably greater than or equal to 200 nm and less than or equal to 500 nm. With use of the thick oxide insulating film 53, the amount of oxygen released from the oxide insulating film 53 can be increased, and defects at the interface between the oxide insulating film 53 and an oxide semiconductor film to be formed later can be reduced, which can be achieved by an increase in the thickness.

The oxide insulating film 53 is formed by a sputtering method, a CVD method or the like. Preferably, the oxide insulating film from which part of contained oxygen is released by heat treatment is easily formed by a sputtering method.

When the oxide insulating film from which part of contained oxygen is released by heat treatment is formed by a sputtering method, the amount of oxygen contained in a deposition gas is preferably large, and oxygen, a mixed gas in oxygen and a rare gas, or the like can be used. Typically, the oxygen concentration of a deposition gas is preferably higher than or equal to 6% and lower than or equal to 100%.

A silicon oxide film can be formed as a typical example of such an oxide insulating film from which part of contained oxygen is released by heat treatment. In that case, the silicon oxide film is preferably formed by a RF sputtering method under the following conditions: quartz (preferably synthetic quartz) is used as a target; the substrate temperature is higher than or equal to 30° C. and lower than or equal to 450° C. (preferably higher than or equal to 70° C. and lower than or equal to 200° C.); the distance between the substrate and the target (the T-S distance) is greater than or equal to 20 mm and less than or equal to 400 mm (preferably greater than or equal to 40 mm and less than or equal to 200 mm); the pressure is higher than or equal to 0.1 Pa and lower than or equal to 4 Pa (preferably higher than or equal to 0.2 Pa and lower than or equal to 1.2 Pa); the high-frequency power is higher than or equal to 0.5 kW and lower than or equal to 12 kW (preferably higher than or equal to 1 kW and lower than or equal to 5 kW); and the proportion of oxygen ($O_2/(O_2+Ar)$) in the deposition gas is higher than or equal to 1% and lower than or equal to 100% (preferably higher than or equal to 6% and lower than or equal to 100%). Note that a silicon target may be used as the target instead of the quartz (preferably synthetic quartz) target. In addition, oxygen alone may be used as the deposition gas.

Note that in the case where a glass substrate including an impurity such as an alkali metal is used, a nitride insulating film such as a silicon nitride film or an aluminum nitride film may be formed between the substrate 51 and the oxide insulating film 53 in order to prevent entry of an alkali metal. The nitride insulating film can be formed by a CVD method, a sputtering method, or the like. Since an alkali metal such as lithium, sodium, or potassium is an impurity, the contained amount of such an alkali metal is preferably small.

Next, over the oxide insulating film 53, an oxide semiconductor film is formed to a thickness greater than or equal to 30 nm and less than or equal to 50 μm by a sputtering method with a sputtering apparatus.

Here, a treatment chamber of the sputtering apparatus is described with reference to FIG. 3A. An evacuation unit 33 and a gas supply unit 35 are connected to a treatment chamber 31. In the treatment chamber 31, a substrate support 40 and a target 41 are provided. The target 41 is connected to a power supply device 37.

The treatment chamber 31 is grounded. When the leakage rate of the treatment chamber 31 is lower than or equal to $1\times10^{-10}$ Pa·m$^3$/sec., entry of an impurity into a film to be formed by a sputtering method can be decreased.

In order to reduce the leakage rate, internal leakage, as well as external leakage, needs to be decreased. The external leakage refers to inflow of a gas from the outside of a vacuum system through a minute hole, a sealing defect, or the like. The internal leakage is due to leakage through a partition, such as a valve, in a vacuum system or due to released gas from an internal member. Measures need to be taken from both aspects of external leakage and internal leakage in order that the leakage rate be less than or equal to $1\times10^{-10}$ Pa·m$^3$/sec.

In order to decrease external leakage, an open/close portion of the treatment chamber is preferably sealed with a metal gasket. For the metal gasket, a metal material covered with iron fluoride, aluminum oxide, or chromium oxide is preferably used. The metal gasket realizes higher adhesion than an O-ring, and can decrease the external leakage. Further, by use of a metal material covered with iron fluoride, aluminum oxide, chromium oxide, or the like which is in the passive state, a released gas containing hydrogen generated from the metal gasket is suppressed, so that the internal leakage can also be decreased.

As a member forming an inner wall of the treatment chamber 31, aluminum, chromium, titanium, zirconium, nickel, or vanadium, from which the amount of a released gas containing hydrogen is smaller, is used. An alloy material containing iron, chromium, nickel, and the like covered with the above-mentioned material may be used. The alloy material containing iron, chromium, nickel, and the like is rigid, resistant to heat, and suitable for processing. Here, when surface unevenness of the member is decreased by polishing or the like to reduce the surface area, the released gas can be reduced. Alternatively, the above-mentioned member of the film formation apparatus may be covered with iron fluoride, aluminum oxide, chromium oxide, or the like which is in the passive state.

The member of the inner wall of the treatment chamber 31 is preferably formed with only a metal material as much as possible. For example, in the case where a viewing window formed with quartz or the like is provided, a surface is preferably covered thinly with iron fluoride, aluminum oxide, chromium oxide, or the like which is in the passive state so as to suppress the released gas.

Furthermore, it is preferable to provide a refiner for a sputtering gas just in front of the treatment chamber 31. At this time, the length of a pipe between the gas refiner and the treatment chamber is less than or equal to 5 m, preferably less than or equal to 1 m. When the length of the pipe is less than or equal to 5 m or less than or equal to 1 m, the effect of the released gas from the pipe can be decreased accordingly.

A pipe through which a sputtering gas flows from a cylinder to the treatment chamber 31 is preferably formed using a metal pipe whose inside is covered with iron fluoride, aluminum oxide, chromium oxide, or the like which is in the passive state. With the above-mentioned pipe, the amount of released gas containing hydrogen is small and entry of impurities into the deposition gas can be reduced as compared with a SUS316L-EP pipe, for example. Further, a high-performance ultra-compact metal gasket joint (a UPG joint) is preferably used as a joint of the pipe. In addition, a structure where all the materials of the pipe are metal materials is preferable, in which the effect of the generated released gas or the external leakage can be decreased as compared to a structure where resin or the like is used.

An adsorbate present at the inner wall of the treatment chamber 31 does not affect the pressure in the treatment chamber because it is adsorbed on the inner wall, but the adsorbate leads to release of gas at the time of the evacuation of the treatment chamber. Therefore, although the leakage rate and the evacuation rate do not have a correlation, it is important that the adsorbate present in the treatment chamber be desorbed as much as possible and evacuation be performed in advance with use of a pump having high evacuation capability. Note that the treatment chamber may be subjected to baking for promotion of desorption of the adsorbate. By the baking, the rate of desorption of the adsorbate can be increased about tenfold. The baking should be performed at a temperature higher than or equal to 100° C. and lower than or equal to 450° C. At this time, when the adsorbate is removed while an inert gas is introduced, the rate of desorption of water or the like, which is difficult to desorb only by evacuation, can be further increased.

The evacuation unit 33 can remove an impurity in the treatment chamber 31 and control the pressure in the treatment chamber 31. An entrapment vacuum pump is preferably used for the evacuation unit 33. For example, a cryopump, an ion pump, or a titanium sublimation pump is preferably used. With use of the above entrapment vacuum pump, the amount of hydrogen contained in the oxide semiconductor film can be reduced.

Evacuation of the treatment chamber 31 is preferably performed with a rough vacuum pump, such as a dry pump, and a high vacuum pump such as a sputter ion pump, a turbo molecular pump or a cryopump, in appropriate combination. The turbo molecular pump has an outstanding capability in evacuation of a large-sized molecule, whereas it has a low capability in evacuation of hydrogen or water. Hence, combination of a cryopump having a high capability in evacuation of water and a sputter ion pump having a high capability in evacuation of hydrogen is effective.

Note that hydrogen contained in the oxide semiconductor film may indicate a hydrogen molecule, water, a hydroxyl group, or a hydride in some cases, in addition to a hydrogen atom.

The gas supply unit 35 is for supplying a gas with which a target is sputtered into the treatment chamber 31. The gas supply unit 35 includes a cylinder filled with gases, a pressure adjusting valve, a stop valve, a mass flow controller, and the like. Providing a refiner for the gas supply unit 35 makes it possible to reduce an impurity contained in a gas introduced into the treatment chamber 31. As the gas with which the target is sputtered, a rear gas such as helium, neon, argon, xenon, or krypton is used. Alternatively, a mixed gas of oxygen and one of the above rare gases can be used.

As the power supply device 37, an RF power supply device, an AC power supply device, a DC power supply device, or the like can be used as appropriate. When a magnet is provided inside or outside a target support for supporting the target, which is not illustrated, high-density plasma can be confined in the periphery of the target, so that an improvement in the deposition rate and a reduction in plasma damage on the substrate can be achieved. This method is referred to as a magnetron sputtering method. Moreover, when the magnet can be rotated in the magnetron sputtering method, non-uniformity of a magnetic field can be suppressed, so that efficiency of use of the target is increased and variation in film quality in the substrate plane can be reduced.

The substrate support 40 is grounded. The substrate support 40 is provided with a heater. As the heater, a heat treatment apparatus for heating an object by heat conduction or heat radiation from a heating element such as a resistance heating element. For example, an electric furnace or a rapid thermal anneal (RTA) apparatus such as a gas rapid thermal anneal (GRTA) apparatus or a lamp rapid thermal anneal (LRTA) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for heat treatment using a high-temperature gas.

As the target 41, a metal oxide target including zinc can be used. As a typical example of the target 41, a four-component metal oxide such as an In—Sn—Ga—Zn-based oxide, a three-component metal oxide such as an In—Ga—Zn-based metal oxide, an In—Sn—Zn-based metal oxide, an In—Al—Zn-based metal oxide, a Sn—Ga—Zn-based metal oxide, an Al—Ga—Zn-based metal oxide, or a Sn—Al—Zn-based metal oxide, a two-component metal oxide such as an In—Zn-based metal oxide or a Sn—Zn-based metal oxide can be used.

As an example of the target 41, a metal oxide target including In, Ga, and Zn has a composition ratio where $In_2O_3$:$Ga_2O_3$:$ZnO$=1:1:1 [molar ratio]. Alternatively, a target having a composition ratio where $In_2O_3$:$Ga_2O_3$:$ZnO$=1:1:2 [molar ratio], a target having a composition ratio where $In_2O_3$:$Ga_2O_3$:$ZnO$=1:1:4 [molar ratio], or a target having a composition ratio where $In_2O_3$:$Ga_2O_3$:$ZnO$=2:1:8 [molar ratio] can be used.

The distance between the target 41 and the substrate 51 (the T-S distance) is set to a distance which enables an element whose atomic weight is low to preferentially reach the oxide insulating film 53 over the substrate 51.

Next, a method for forming a crystalline oxide semiconductor film over the oxide insulating film is described.

Figure 3A:
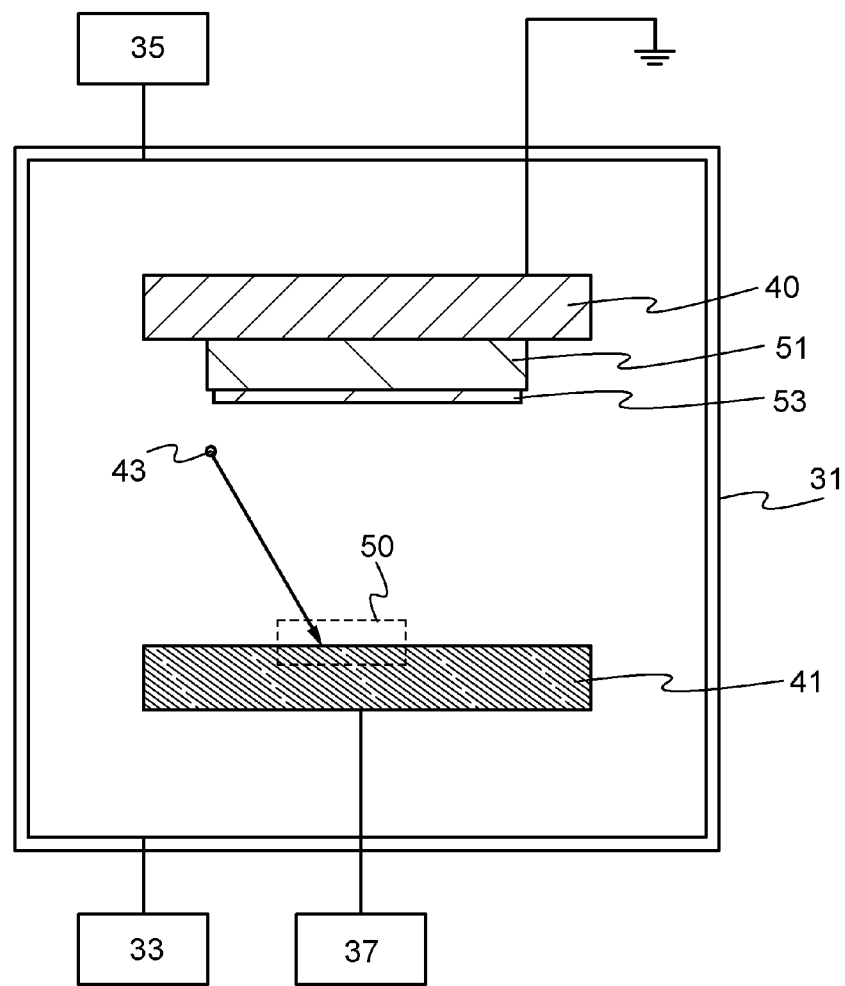
FIGS. 3A and 3B are schematic diagrams for describing a sputtering apparatus.
Figure 3B:
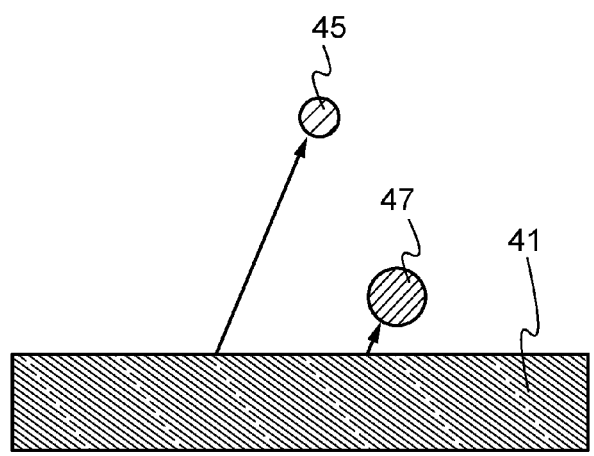

As illustrated in FIG. 3A, the substrate 51 over which the oxide insulating film 53 is formed is placed on the substrate support 40 in the treatment chamber 31 of the sputtering apparatus. Next, a gas for sputtering the target 41 is introduced from the gas supply unit 35 into the treatment chamber 31. The purity of the target 41 is higher than or equal to 99.9%, preferably higher than or equal to 99.99%. Then, power is supplied to the power supply device 37 connected to the target 41. As a result, with use of an ion 43 and an electron in the sputtering gas introduced from the gas supply unit 35 into the treatment chamber 31, the target 41 is sputtered. In this embodiment, the distance between the target 41 and the substrate 51 is set so that an element whose atomic weight is low can preferentially reach the oxide insulating film 53 on the substrate 51 to be deposited. Thus, as illustrated in FIG. 3B, an element 45 with the low atomic weight among elements contained in the target 41 is preferentially transferred to the substrate side more than an element 47 with the high atomic weight.

In the target 41 used in this embodiment, zinc has a lower atomic weight than tin and indium. Thus, zinc is preferentially deposited on the oxide insulating film 53. Further, an atmosphere in the deposition contains oxygen, and the substrate support 40 is provided with a heater for heating the substrate and the deposited film during deposition. Thus, the zinc deposited on the oxide insulating film 53 is oxidized, so that a seed crystal 55a with a hexagonal crystal structure including zinc, typically, a seed crystal including zinc oxide with a hexagonal crystal structure is formed.

In the case where the target 41 includes an atom of aluminum or the like with lower atomic weight than zinc, aluminum, as well as zinc, is preferentially deposited on the oxide insulating film 53.

Figure 4A:
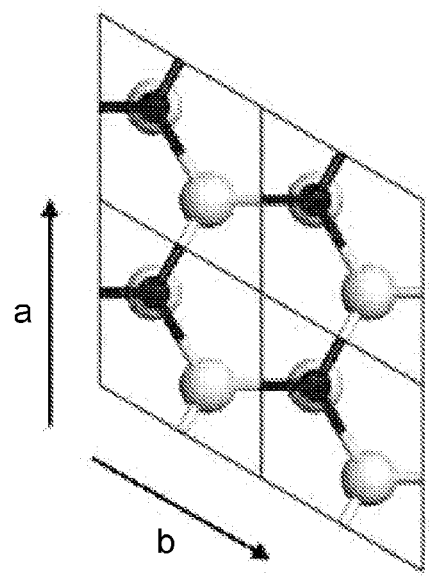
FIGS. 4A and 4B are schematic diagrams illustrating a crystal structure of a seed crystal.
Figure 4B:
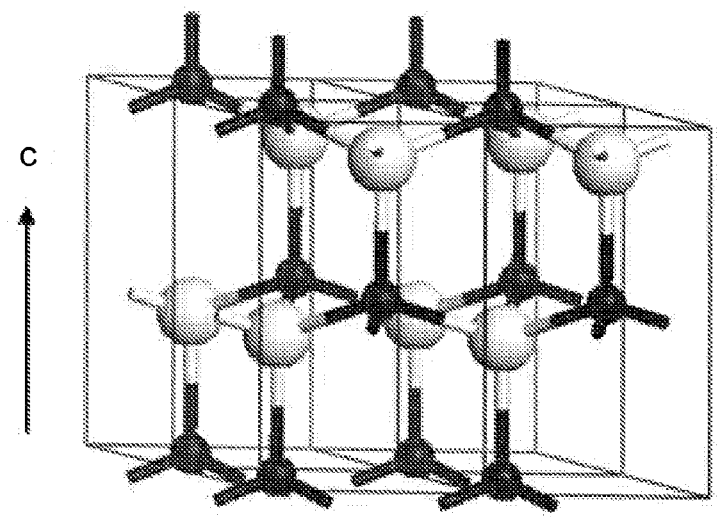
Figure 4B:
Figure 4B:

The seed crystal 55a has a hexagonal crystal structure including zinc. In such a structure, bonds for forming hexagonal lattices are formed in the a-b plane, and c-axes are substantially perpendicular to a plane surface of the substrate which is substantially parallel to the a-b plane. Here, a crystal with a hexagonal structure including zinc, in which bonds for forming hexagonal lattices are formed in the a-b plane, and c-axes are substantially perpendicular to a plane surface of the substrate which is substantially parallel to the a-b plane, is described with reference to FIGS. 4A and 4B. As a typical example of a crystal with a hexagonal structure including zinc, zinc oxide is used for description. Black spheres represent zinc, and white spheres represent oxygen. FIG. 4A is a schematic diagram of zinc oxide with a hexagonal structure in the a-b plane, and FIG. 4B is a schematic diagram of zinc oxide with a hexagonal structure in which the vertical direction is the c-axis direction. As illustrated in FIG. 4A, in a plan top surface of the a-b plane, zinc and oxygen are bonded to form a hexagonal shape. As illustrated in FIG. 4B, layers in each of which zinc and oxygen are bonded to form hexagonal lattices are stacked, and the c-axis direction is perpendicular to the a-b plane.

The seed crystal 55a includes, in the c-axis direction, at least one atomic layer in which bonds for forming hexagonal lattices are formed in the a-b plane.

As a sputtering as, a rare gas (typically argon), an oxygen gas, or a mixed gas of a rare gas and oxygen is used as appropriate. It is preferable that a high-purity gas from which impurities such as hydrogen, water, a hydroxyl group, and a hydride are removed be used as a sputtering gas.

The target 41 is continuously sputtered with use of the sputtering gas, whereby atoms included in the target are deposited on the seed crystal 55a. At this time, crystal growth is caused with use of the seed crystal 55a as a nucleus, so that a crystalline oxide semiconductor film 55b with a hexagonal crystal structure can be formed on the seed crystal 55a. Note that since the substrate 51 is heated by the heater provided for the substrate support 40, crystal growth of the atoms deposited on the surface is performed with use of the seed crystal 55a as a nucleus while the atoms are oxidized; a crystalline oxide semiconductor film can be accordingly formed.

The temperature of the substrate heated by the heater is higher than or equal to 200° C. and lower than or equal to 400° C., preferably higher than or equal to 250° C. and lower than or equal to 350° C. Film formation is performed while the substrate is heated at higher than or equal to 200° C. and lower than or equal to 400° C., preferably higher than or equal to 250° C. and lower than or equal to 350° C., whereby a first heat treatment is performed. Note that the temperature of a surface where a film is formed in the sputtering is higher than or equal to 250° C. and lower than or equal to the upper limit of the heating treatment of the substrate.

In formation of the crystalline oxide semiconductor film 55b, crystal growth of an atom with high atomic weight on a surface of the target 41 and of a sputtered atom with low atomic weight after formation of the seed crystal 55a is caused with use of the seed crystal 55a as a nucleus while the atoms are oxidized. Thus, like the seed crystal 55a, the crystalline oxide semiconductor film 55b has a hexagonal crystal structure including zinc, in which bonds for forming hexagonal lattices are formed in the a-b plane and c-axes are substantially perpendicular to a plan surface of the substrate which is substantially parallel to the a-b plane. That is, a crystalline oxide semiconductor film 55 including the seed crystal 55a and the crystalline oxide semiconductor film 55b has a hexagonal crystal structure including zinc, in which bonds for forming hexagonal lattices are formed in the a-b plane which is parallel to a surface of the oxide insulating film 53 and c-axes are substantially perpendicular to a plan surface of the substrate which is substantially parallel to the a-b plane. The crystalline oxide semiconductor film 55 described in this embodiment does not have an amorphous structure but a crystalline structure, ideally, a single crystal structure, and is a crystalline (also referred to as C-Axis Aligned Crystal (CAAC)) oxide semiconductor in which a c-axis is substantially perpendicular to a plan surface of the substrate.

When the pressure of the treatment chamber including the substrate support 40 and the target 41 is lower than or equal to 0.4 Pa, impurities such an alkali metal or hydrogen entering a surface of the crystalline oxide semiconductor film or the inside thereof can be reduced.

Moreover, when the leakage rate of the treatment chamber of the sputtering apparatus is set to lower than or equal to $1\times10^{-10}$ Pa·m³/sec., entry of impurities such as an alkali metal, hydrogen, water, a hydroxyl group, or a hydride into the crystalline oxide semiconductor film that is being formed by a sputtering method can be reduced. Further, with use of an entrapment vacuum pump as an evacuation system, counter flow of impurities such as an alkali metal, hydrogen, water, a hydroxyl group, or hydride from the evacuation system can be reduced.

When the purity of the target is set to higher than or equal to 99.99%, alkali metal, hydrogen, water, a hydroxyl group, a hydride, or the like entering the crystalline oxide semiconductor film can be reduced. With use of the target, in the crystalline oxide semiconductor film 55, the concentration of lithium can be lower than or equal to $5\times10^{15}$ atoms/cm³, preferably lower than or equal to $1\times10^{15}$ atoms/cm³, the concentration of sodium can be lower than or equal to $5\times10^{16}$ atoms/cm³, preferably lower than or equal to $1\times10^{16}$ atoms/cm³, further preferably lower than or equal to $1\times10^{15}$ atoms/cm³, and the concentration of potassium can be lower than or equal to $5\times10^{15}$ atoms/cm³, preferably lower than or equal to $1\times10^{15}$ atoms/cm³.

An alkali metal and an alkaline earth metal are adverse impurities for the crystalline oxide semiconductor and are preferably contained as little as possible. Of alkali metals, in particular, sodium is dispersed in an oxide insulating film which is in contact with the crystalline oxide semiconductor to be a sodium ion (Na⁺). In addition, Na cuts the bond between a metal and oxygen or enters the bond in the crystalline oxide semiconductor. As a result, transistor characteristics deteriorate (e.g., the transistor becomes normally-on (the shift of a threshold voltage to a negative side) or the mobility is decreased). In addition, this also causes variation in the characteristics. Such a problem is significant especially in the case where the hydrogen concentration in the crystalline oxide semiconductor is sufficiently low. Therefore, the concentration of an alkali metal is strongly required to set to the above value in the case where the hydrogen concentration in the crystalline oxide semiconductor is lower than or equal to $5\times10^{19}$ atoms/cm³, particularly lower than or equal to $5\times10^{18}$ atoms/cm³.

The crystalline oxide semiconductor film is formed under the above conditions, whereby the amount of impurities in the crystalline oxide semiconductor film can be extremely small (the concentration of alkali metal is lower than or equal to $5\times10^{16}$ atoms/cm³, and the concentration of hydrogen is lower than or equal to $1\times10^{19}$ atoms/cm³). By reduction of the impurities in the crystalline oxide semiconductor film, crystal growth of the seed crystal and the crystalline oxide semiconductor film is promoted, and further, a single crystal oxide semiconductor film or a substantially single crystal oxide semiconductor film can be formed.

In the crystalline oxide semiconductor, oxygen bonded to a metal element has lower reactivity with hydrogen than oxygen in an amorphous oxide semiconductor; thus, generation of defects can be reduced. Therefore, a transistor in which a channel region is formed in the crystalline oxide semiconductor film has a small amount of change in the threshold voltage between before and after light irradiation or the BT test and thus has stable electric characteristics.

Further, in the formation step of the crystalline oxide semiconductor film, at least one, preferably all, of the above conditions which are the pressure of the treatment chamber, the temperature of the surface where a film is formed, the leakage rate of the treatment chamber, and the purity of the target is employed, whereby entry of hydrogen and an alkali metal into the oxide insulating film and the crystalline oxide semiconductor can be reduced. In addition, diffusion of hydrogen and an alkali metal from the oxide insulating film to the crystalline oxide semiconductor film can be reduced. Hydrogen contained in the oxide semiconductor is reacted with oxygen bonded to a metal atom to be water, and in addition, a defect is formed in a lattice from which oxygen is detached (or a portion from which oxygen is removed).

Thus, the impurities are reduced as much as possible in the formation step of the crystalline oxide semiconductor film, whereby defects in the crystalline oxide semiconductor film can be reduced. From the above, the transistor in which a channel region is formed in the crystalline oxide semiconductor film has a small amount of change in threshold voltage between before and after light irradiation or the BT test and thus has stable electric characteristics.

According to this embodiment, in one sputtering step, by utilizing a difference in atomic weight of atoms in the target, zinc with low atomic weight is preferentially deposited over the oxide insulating film to form a seed crystal, and then tin, indium, or the like with high atomic weight are deposited on the seed crystal while causing crystal growth. Thus, the crystalline oxide semiconductor film can be formed without performing a plurality of steps. Further, since an oxide semiconductor with a hexagonal crystal structure is deposited using the seed crystal with a hexagonal crystal structure including zinc, a single crystal oxide semiconductor film or a substantially single crystal oxide semiconductor film can be formed.

Note that a metal oxide which can be used for the crystalline oxide semiconductor film 55 has an energy gap of 2 eV or more, preferably 2.5 eV or more, further preferably 3 eV or more. In this manner, off-state current of the transistor can be reduced by using a metal oxide having a wide band gap.

In this embodiment, the crystalline oxide semiconductor film 55 is formed by a sputtering method with use of an In—Ga—Zn—O-based metal oxide target and a mixed gas of argon and oxygen as a sputtering gas.

Next, a heat treatment is performed on the substrate 51, so that hydrogen is released from the crystalline oxide semiconductor film 55 and part of oxygen contained in the oxide insulating film 53 is diffused into the crystalline oxide semiconductor film 55 and in the vicinity of the interface between the crystalline oxide insulating film 53 and the oxide semiconductor film 55.

The temperature of the heat treatment is preferably a temperature at which hydrogen is released from the crystalline oxide semiconductor film 55 and part of oxygen contained in the oxide insulating film 53 is released and diffused into the crystalline oxide semiconductor film 55. The temperature is typically higher than or equal to 150° C. and lower than the strain point of the substrate 51, preferably higher than or equal to 250° C. and lower than or equal to 450° C. When the heat treatment temperature is higher than the deposition temperature of the crystalline oxide semiconductor film, a large amount of oxygen contained in the oxide insulating film 53 can be released.

The heat treatment is preferably conducted in an inert gas atmosphere; typically it is preferably performed in a rare gas (such as helium, neon, argon, xenon, or krypton) atmosphere or a nitrogen atmosphere. Alternatively, the heat treatment may be performed in a reduced-pressure atmosphere.

This heat treatment enables release of hydrogen from the crystalline oxide semiconductor film 55 and diffusion of part of oxygen contained in the oxide insulating film 53 into the crystalline oxide semiconductor film 55 and in the vicinity of the interface between the oxide insulating film 53 and the crystalline oxide semiconductor film 55. In this process, oxygen vacancies in the crystalline oxide semiconductor film 55 can be reduced and oxygen is diffused in the vicinity of the interface between the oxide insulating film 53 and the crystalline oxide semiconductor film 55, thereby reducing defects at the interface between the oxide semiconductor film and the oxide insulating film. As a result, a crystalline oxide semiconductor film in which the hydrogen concentration and oxygen vacancies are reduced can be formed.

Next, a mask is formed over the crystalline oxide semiconductor film which has been subjected to the heat treatment, and then the crystalline oxide semiconductor film is selectively etched with use of the mask, so that a crystalline oxide semiconductor film 59 is formed. After that, the mask is removed (see FIG. 1C).

The mask used in the etching of the crystalline oxide semiconductor film 55 can be formed as appropriate by a photolithography step, an inkjet method, a printing method or the like. Wet etching or dry etching may be employed as appropriate for the etching of the crystalline oxide semiconductor film 55.

Figure 1B:
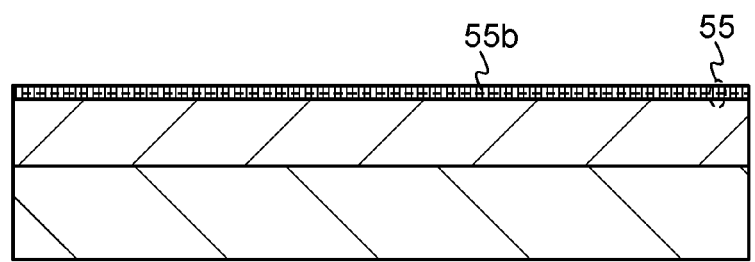
Figure 1C:
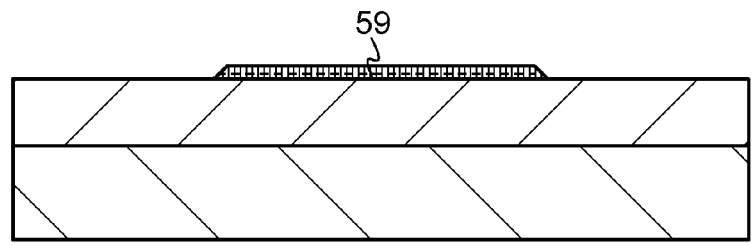
Figure 1D:
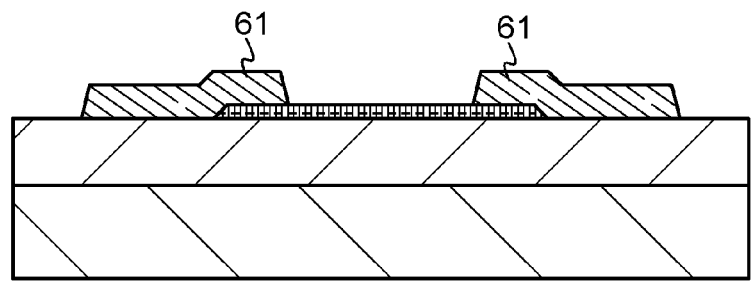

Next, as illustrated in FIG. 1D, a pair of electrodes 61 in contact with the crystalline oxide semiconductor film 59 is formed.

The pair of electrodes 61 functions as a source electrode and a drain electrode.

The pair of electrodes 61 can be formed using a metal element selected from the group of aluminum, chromium, copper, tantalum, titanium, molybdenum, and tungsten; an alloy containing any of these metal elements as a component; an alloy containing these metal elements in combination; and the like. Further, one or more metal elements selected from manganese or zirconium may be used. In addition, the pair of electrodes 61 can have a single-layer structure or a stacked structure having two or more layers. For example, a single-layer structure of an aluminum film containing silicon, a two-layer structure in which a titanium film is stacked over an aluminum film, a two-layer structure in which a titanium film is stacked over a titanium nitride film, a two-layer structure in which a tungsten film is stacked over a titanium nitride film, a two-layer structure in which a tungsten film is stacked over a tantalum nitride film, a three-layer structure in which a titanium film, an aluminum film, and a titanium film are stacked in this order, and the like can be given.

The pair of electrodes 61 can be formed using a light-transmitting conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added. It is also possible to have a stacked-layer structure formed using the above light-transmitting conductive material and the above metal element.

The pair of electrodes 61 is formed by a printing method or an inkjet method. Alternatively, after a conductive film is formed by a sputtering method, a CVD method, an evaporation method or the like, a mask is formed over the conductive film and the conductive film is etched, and thereby the pair of electrodes 61 is formed. The mask formed over the conductive film can be formed by an inkjet method, a printing method, a photolithography method, or the like as appropriate.

At this time, the conductive film is formed over the crystalline oxide semiconductor film 59 and the oxide insulating film 53, and etched into a predetermined pattern to form the pair of electrodes 61.

Note that the conductive film is formed over the crystalline oxide semiconductor film which has been subjected to the heat treatment, and a concavo-convex shaped mask is formed with use of a multi-tone photo-mask. The crystalline oxide semiconductor film which has been subjected to the heat treatment and the conductive film are etched with use of the mask. Then, the concavo-convex shaped mask is separated by ashing, and the conductive film is etched selectively with use of the separated masks to form the crystalline oxide semiconductor film and the pair of electrodes. With this process, the number of the photo-masks used and the number of steps in the photolithography process can be reduced.

Then, a gate insulating film 63 is formed over the crystalline oxide semiconductor film 59 and the pair of electrodes 61.

Next, a gate electrode 65 is formed in a region which is above the gate insulating film 63 and overlaps with the crystalline oxide semiconductor film 59.

Figure 1E:
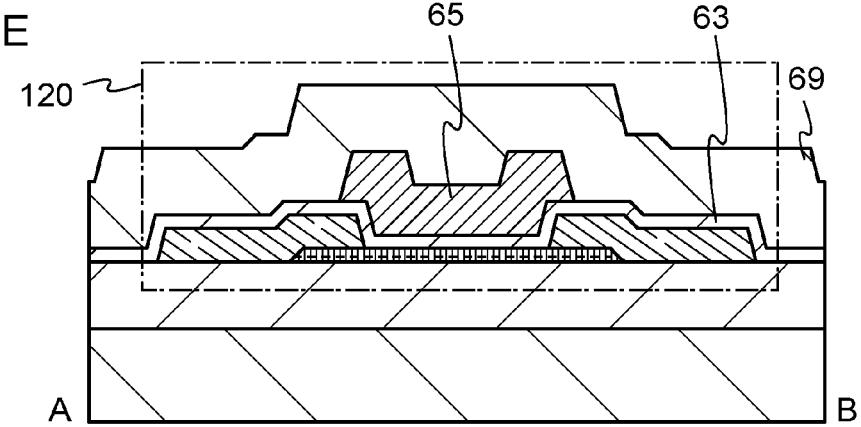
Figure 2:
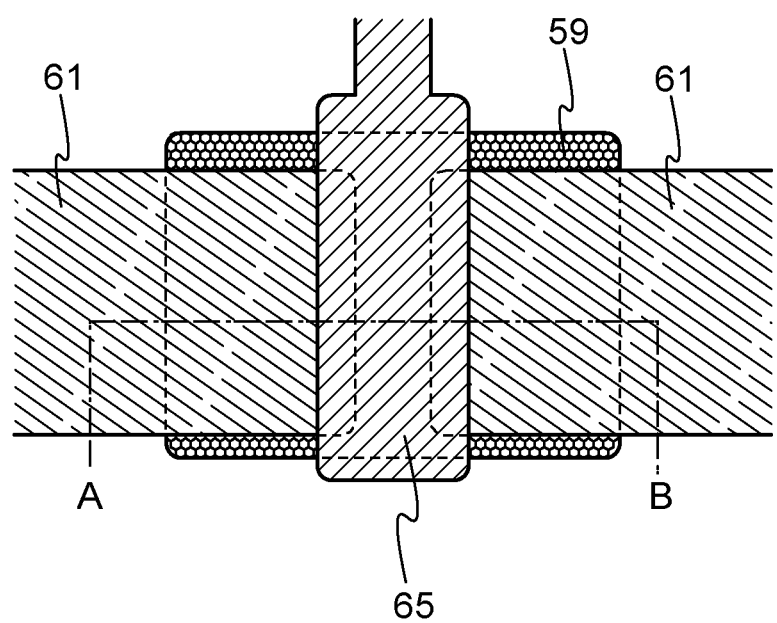
FIG. 2 is a top view illustrating a process for manufacturing a semiconductor device according to one embodiment of the present invention.

After that, an insulating film 69 may be formed as a protective film (FIG. 1E). In addition, after contact holes are formed in the gate insulating film 63 and the insulating film 69, wirings connected to the pair of electrodes 61 may be formed.

The gate insulating film 63 can be formed with a single layer or a stacked layer of silicon oxide, silicon oxynitride, silicon nitride, silicon nitride oxide, aluminum oxide, aluminum oxynitride or gallium oxide. It is preferable that a portion in the gate insulating film 63 which is in contact with the crystalline oxide semiconductor film 59 contain oxygen. It is further preferable that the gate insulating film 63 be formed using an oxide insulating film from which oxygen is released by heating, which is similar to the oxide insulating film 53. By using the silicon oxide film, it is possible to diffuse oxygen to the crystalline oxide semiconductor film 59, so that its characteristics can be improved.

The gate insulating film 63 is formed using a high-k material such as hafnium silicate ($HfSiO_x$), hafnium silicate to which nitrogen is added ($HfSi_xO_yN_z$), hafnium aluminate to which nitrogen is added ($HfAl_xO_yN_z$), hafnium oxide, or yttrium oxide, so that gate leakage current can be decreased. Further, a stacked structure can be used in which a high-k material and one or more of silicon oxide, silicon nitride, silicon oxynitride, silicon nitride oxide, aluminum oxide, aluminum oxynitride and gallium oxide are stacked. For example, the thickness of the gate insulating film 63 is preferably greater than or equal to 1 nm and less than or equal to 300 nm, and further preferably greater than or equal to 5 nm and less than or equal to 50 nm.

Before the gate insulating film 63 is formed, the surface of the crystalline oxide semiconductor film 59 may be exposed to plasma of an oxidative gas such as oxygen, ozone or dinitrogen monoxide so as to be oxidized, thereby reducing the oxygen vacancy.

The gate electrode 65 can be formed using a metal element selected from the group of aluminum, chromium, copper, tantalum, titanium, molybdenum, and tungsten; an alloy containing any of these metal elements as a component; an alloy containing these metal elements in combination; and the like. Further, one or more metal elements selected from manganese or zirconium may be used. Further, the gate electrode 65 may have a single-layer structure or a stacked-layer structure of two or more layers. For example, a single-layer structure of an aluminum film containing silicon, a two-layer structure in which a titanium film is stacked over an aluminum film, a two-layer structure in which a titanium film is stacked over a titanium nitride film, a two-layer structure in which a tungsten film is stacked over a titanium nitride film, a two-layer structure in which a tungsten film is stacked over a tantalum nitride film, a three-layer structure in which a titanium film, an aluminum film, and a titanium film are stacked in this order, and the like can be given.

The gate electrode 65 can be formed using a light-transmitting conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added. It is also possible to have a stacked-layer structure formed using the above light-transmitting conductive material and the above metal element.

The insulating film 69 can be formed as appropriate with any of the insulating films listed for the gate insulating film 63. When a silicon nitride film is formed as the insulating film 69 by a sputtering method or a CVD method, entry of moisture and an alkali metal from the outside can be prevented, and thus the amount of impurities contained in the crystalline oxide semiconductor film can be reduced.

Note that after the gate insulating film 63 is formed or the insulating film 69 is formed, a heat treatment may be performed. By the heat treatment, oxygen diffuses from the gate insulating film 63 to the crystalline oxide semiconductor film. The higher the temperature of the heat treatment is, the smaller the amount of change in the threshold value due to a—BT test performed while light is being irradiated is.

Through the above steps, a transistor 120 in which a channel region is formed in the crystalline oxide semiconductor film can be formed. The crystalline oxide semiconductor film including a channel region of the transistor 120 has a hexagonal crystal structure in which bonds for forming hexagonal lattices are formed in the a-b plane and the c-axes are substantially perpendicular to a plan surface of the substrate which is substantially parallel to the a-b plane. Such a transistor 120 has a small amount of change in the threshold voltage between before and after light irradiation or the BT test and thus can have stable electric characteristics.

Embodiment 2

In this embodiment, a manufacturing method of a transistor having a structure different from that in Embodiment 1 will be described with reference to FIGS. 5A to 5D and FIG. 6. The transistor in this embodiment is different from that in Embodiment 1 in that a pair of electrodes is provided between an oxide insulating film and a crystalline oxide semiconductor film. Note that the cross-sectional view taken along the dot-dash line C-D in FIG. 6 corresponds to FIG. 5D.

Figure 5A:
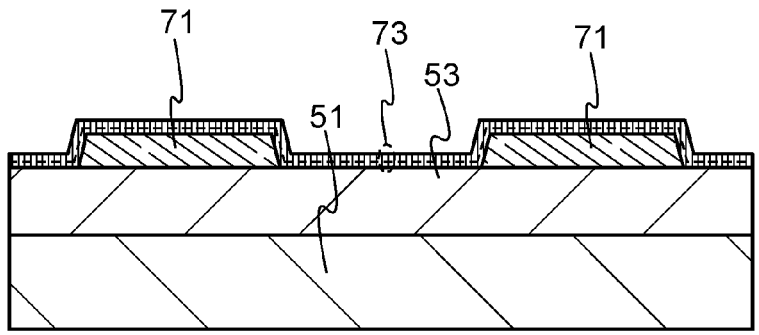
FIGS. 5A to 5D are cross-sectional views illustrating a process for manufacturing a semiconductor device according to one embodiment of the present invention.
Figure 5B:
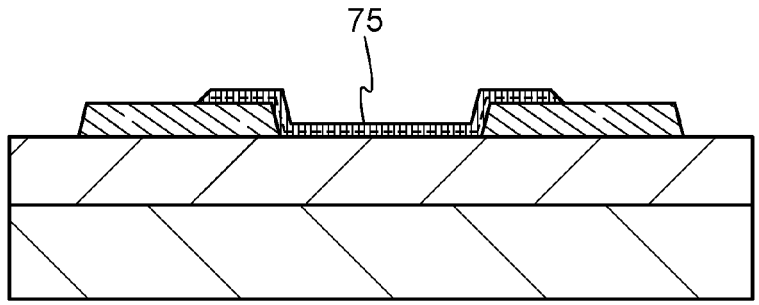

As illustrated in FIG. 5A, the oxide insulating film 53 is formed over the substrate 51 as in Embodiment 1. A pair of electrodes 71 is formed over the oxide insulating film 53. A crystalline oxide semiconductor film 73 is formed over the pair of electrodes 71 and the oxide insulating film 53.

The pair of electrodes 71 can be formed as appropriate by using a material and by a formation method which are similar to those of the pair of electrodes 61 described in Embodiment 1.

The crystalline oxide semiconductor film 73 can be formed as appropriate by using a material and by a formation method which are similar to those of the crystalline oxide semiconductor film 55 described in Embodiment 1.

Then, as in Embodiment 1, the substrate 51 is heated so that a crystalline oxide semiconductor film with the lowered hydrogen concentration and the reduced oxygen vacancies is formed. After that, a mask is formed over the crystalline oxide semiconductor film with the lowered hydrogen concentration and the reduced oxygen vacancies and etching is conducted on the crystalline oxide semiconductor film with the lowered hydrogen concentration and the reduced oxygen vacancies to form a crystalline oxide semiconductor film 75. After that, the mask is removed (see FIG. 5B).

Figure 5C:
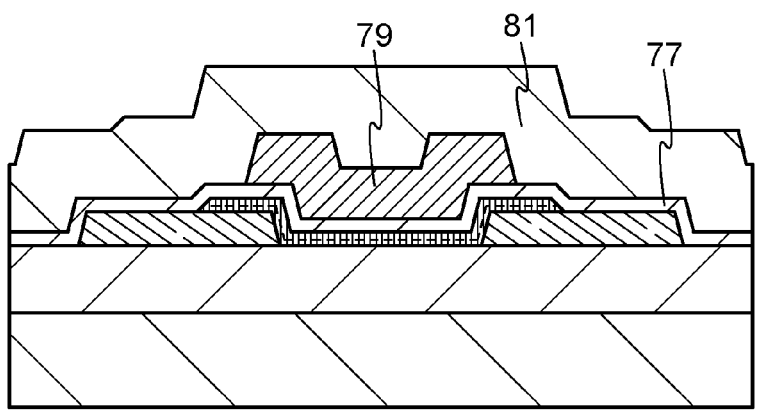
Figure 5D:
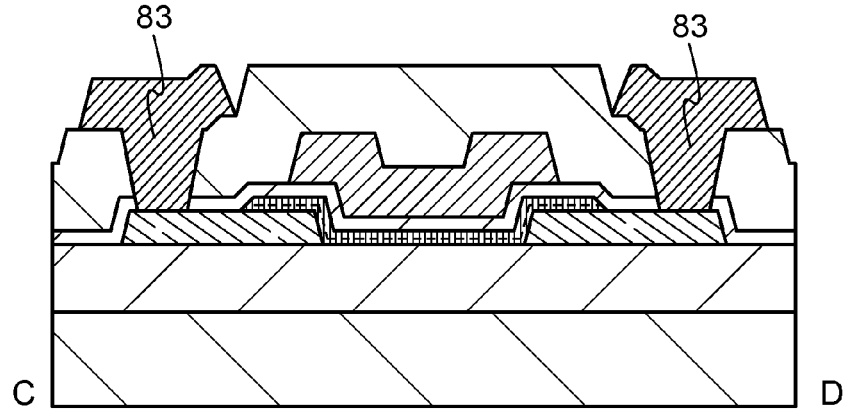
Figure 6:
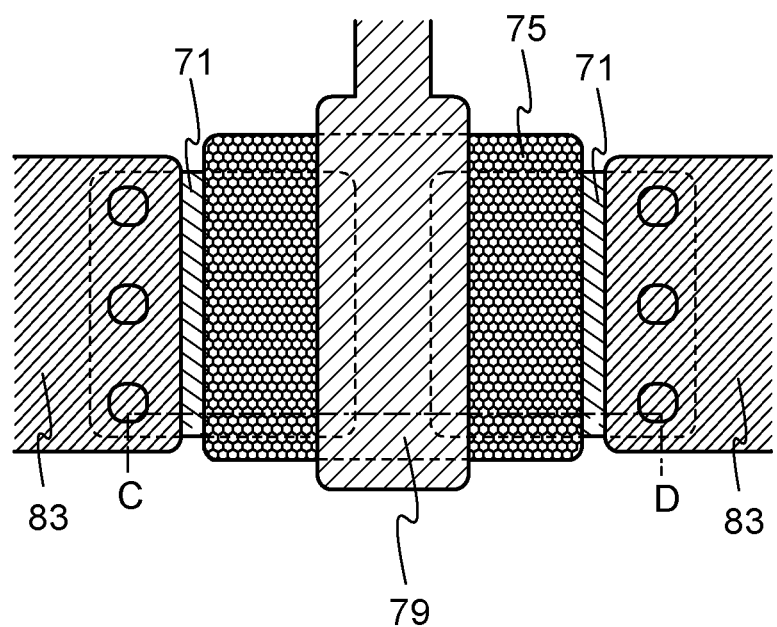
FIG. 6 is a top view illustrating a process for manufacturing a semiconductor device according to one embodiment of the present invention.

As illustrated in FIG. 5C, a gate insulating film 77 is formed over the pair of electrodes 71 and the crystalline oxide semiconductor film 75. Then, a gate electrode 79 is formed in a region which is above the gate insulating film 77 and overlaps with the oxide semiconductor film 75. Then, an insulating film 81 may be formed over the gate insulating film 77 and the gate electrode 79 as a protective film.

The gate insulating film 77 can be formed as appropriate by using a material and by a formation method which are similar to those of the gate insulating film 63 described in Embodiment 1.

The gate electrode 79 can be formed as appropriate by using a material and by a formation method which are similar to those of the gate electrode 65 described in Embodiment 1.

The insulating film 81 can be formed as appropriate by using a material and by a formation method which are similar to those of the insulating film 69 described in Embodiment 1.

Then, after a mask is formed over the insulating film 81, the gate insulating film 77 and the insulating film 81 are partially etched to form contact holes. Wirings 83 are formed so as to be connected to the pair of electrodes 71 through the contact holes.

The wirings 83 can be formed as appropriate by using a material and a formation method which are similar to those of the pair of electrodes 71.

Through the above steps, a transistor having the crystalline oxide semiconductor film in a channel formation region can be formed. The crystalline oxide semiconductor film has a hexagonal crystal structure where bonds for forming hexagonal lattices are formed in the a-b plane and the c-axes are substantially perpendicular to a plan surface of the substrate which is substantially parallel to the a-b plane. Such a transistor including the crystalline oxide semiconductor film in the channel region has a small amount of change in the threshold voltage between before or after light irradiation and the BT test; thus, the transistor can have stable electric characteristics.

Note that this embodiment can be combined with any of the other embodiments, as appropriate.

Embodiment 3

In this embodiment, a transistor which is different from the transistors in Embodiment 1 and Embodiment 2 will be described with reference to FIGS. 7A to 7C and FIG. 8. The transistor in this embodiment has a bottom-gate structure in which a gate electrode is provided on the substrate side, which is different from the transistors in Embodiment 1 and Embodiment 2. Note that the cross-sectional view taken along the dot-dash line E-F in FIG. 8 corresponds to FIG. 7C.

Figure 7A:
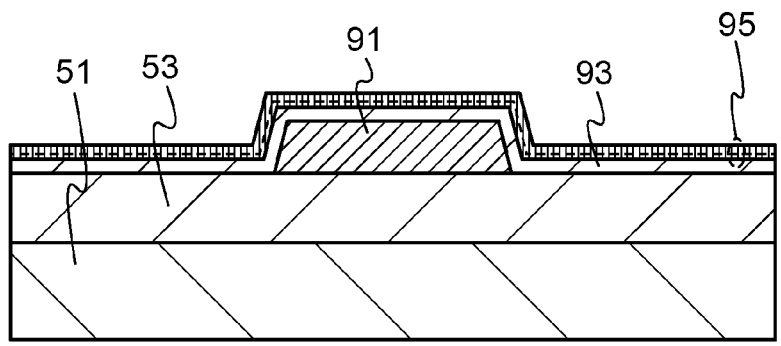
FIGS. 7A to 7C are cross-sectional views illustrating a process for manufacturing a semiconductor device according to one embodiment of the present invention.
Figure 7B:
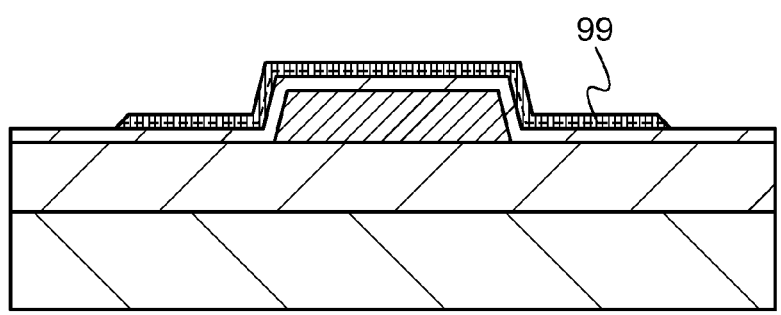

As illustrated in FIG. 7A, the oxide insulating film 53 is formed over the substrate 51. A gate electrode 91 is formed over the oxide insulating film 53. A gate insulating film 93 is formed over the oxide insulating film 53 and the gate electrode 91. Then, a crystalline oxide semiconductor film 95 is formed over the gate insulating film 93 as in Embodiment 1.

The gate electrode 91 can be formed in a manner similar to that of the gate electrode 65 in Embodiment 1.

The gate insulating film 93 can be formed in a manner similar to that of the gate insulating film 63 in Embodiment 1.

The crystalline oxide semiconductor film 95 can be formed in a manner similar to that of the crystalline oxide semiconductor film 55 in Embodiment 1.

Next, as in Embodiment 1, the crystalline oxide semiconductor film 95 is heated to form a crystalline oxide semiconductor film with the lowered hydrogen concentration and the reduced oxygen vacancies.

Then, a mask is formed over the crystalline oxide semiconductor film with the lowered hydrogen concentration and the reduced oxygen vacancies, and etching is conducted on the crystalline oxide semiconductor film with the lowered hydrogen concentration and the reduced oxygen vacancies to form a crystalline oxide semiconductor film 99. After that, the mask is removed (see FIG. 7B).

Figure 7C:
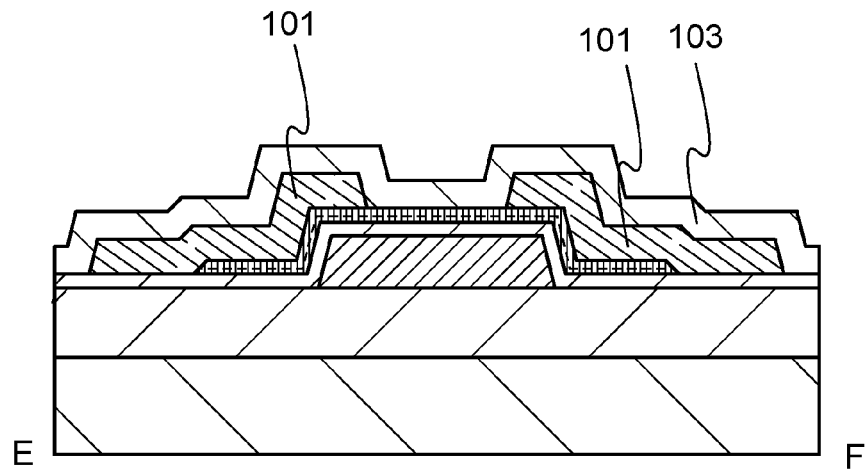
Figure 8:
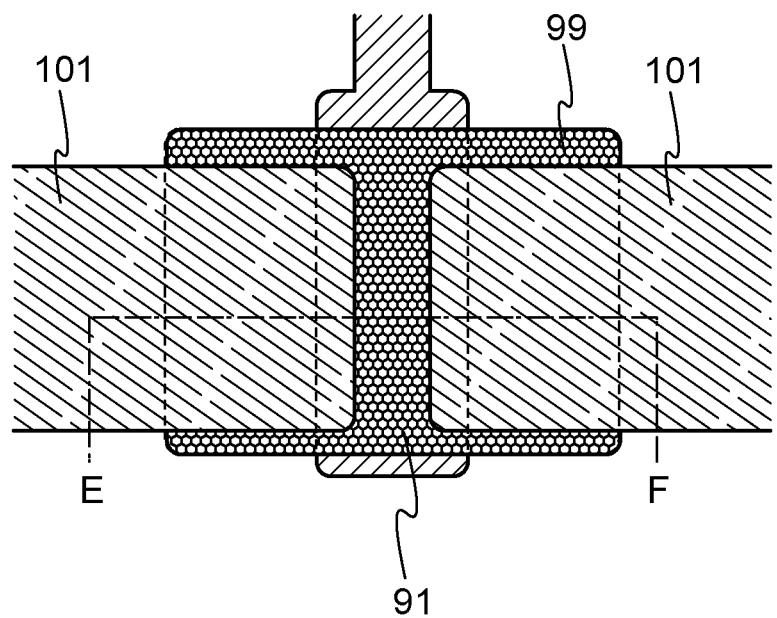
FIG. 8 is a top view illustrating a process for manufacturing a semiconductor device according to one embodiment of the present invention.

Next, as illustrated in FIG. 7C, a pair of electrodes 101 is formed over the crystalline oxide semiconductor film 99. Then, an insulating film 103 is formed over the crystalline oxide semiconductor film 99 and the pair of electrodes 101.

The pair of electrodes 101 can be formed as appropriate by using a material and by a formation method which are similar to those of the pair of electrodes 61 described in Embodiment 1.

The insulating film 103 can be formed in a manner similar to that of the gate insulating film 63 in Embodiment 1.

After that, heat treatment may be performed.

Through the above steps, a transistor having the crystalline oxide semiconductor film in a channel formation region can be formed. The crystalline oxide semiconductor film has a hexagonal crystal structure where bonds for forming hexagonal lattices are formed in the a-b plane and the c-axes are substantially perpendicular to a plan surface of the substrate which is substantially parallel to the a-b plane. Such a transistor including the crystalline oxide semiconductor film in the channel region has a small amount of change in the threshold voltage between before and after light irradiation or the BT test; thus, the transistor can have stable electric characteristics.

Note that this embodiment can be combined with any of the other embodiments, as appropriate.

Embodiment 4

In this embodiment, a transistor having a bottom-gate structure which is different from that of the transistor in Embodiment 3 will be described with reference to FIGS. 9A to 9D and FIG. 10. This embodiment is different from Embodiment 3 in that a pair of electrodes is provided between a gate insulating film and an oxide semiconductor film. Note that the cross-sectional view taken along the dot-dash line G-H in FIG. 10 corresponds to FIG. 9D.

Figure 9A:
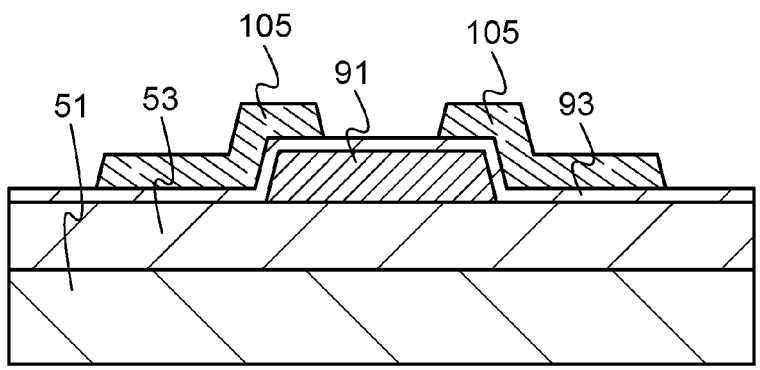
FIGS. 9A to 9D are cross-sectional views illustrating a process for manufacturing a semiconductor device according to one embodiment of the present invention.

As illustrated in FIG. 9A, the oxide insulating film 53 is formed over the substrate 51. Next, the gate electrode 91 is formed over the oxide insulating film 53. The gate insulating film 93 is formed over the oxide insulating film 53 and the gate electrode 91. Then, a pair of electrodes 105 is formed over the gate insulating film 93.

The pair of electrodes 105 can be formed as appropriate by using a material and by a formation method which are similar to those of the pair of electrodes 61 described in Embodiment 1.

Figure 9B:
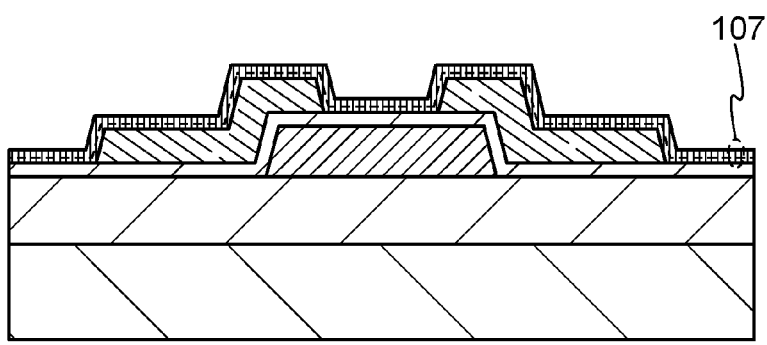
Figure 9C:
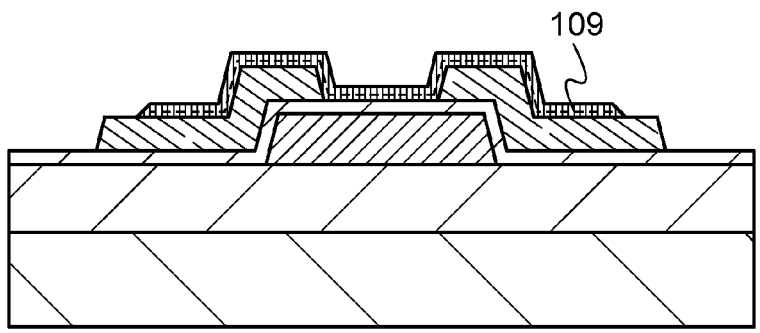

Next, as illustrated in FIG. 9B, a crystalline oxide semiconductor film 107 is formed over the gate insulating film 93 in a manner similar to that in Embodiment 1.

The crystalline oxide semiconductor film 107 can be formed in a manner similar to that of the crystalline oxide semiconductor film 55 in Embodiment 1.

Next, as in Embodiment 1, the crystalline oxide semiconductor film 107 is heated to form a crystalline oxide semiconductor film with the lowered hydrogen concentration and the reduced oxygen vacancies.

Then, a mask is formed over the crystalline oxide semiconductor film with the lowered hydrogen concentration and the reduced oxygen vacancies, and etching is conducted on the crystalline oxide semiconductor film with the lowered hydrogen concentration and the reduced oxygen vacancies to form a crystalline oxide semiconductor film 109. After that, the mask is removed (see FIG. 9C).

Figure 9D:
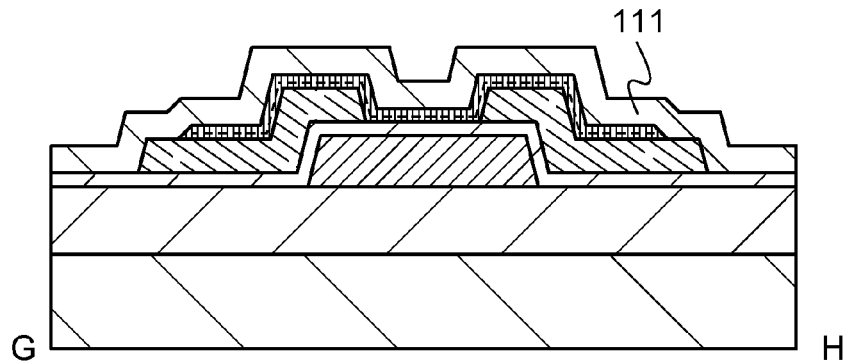
Figure 10:
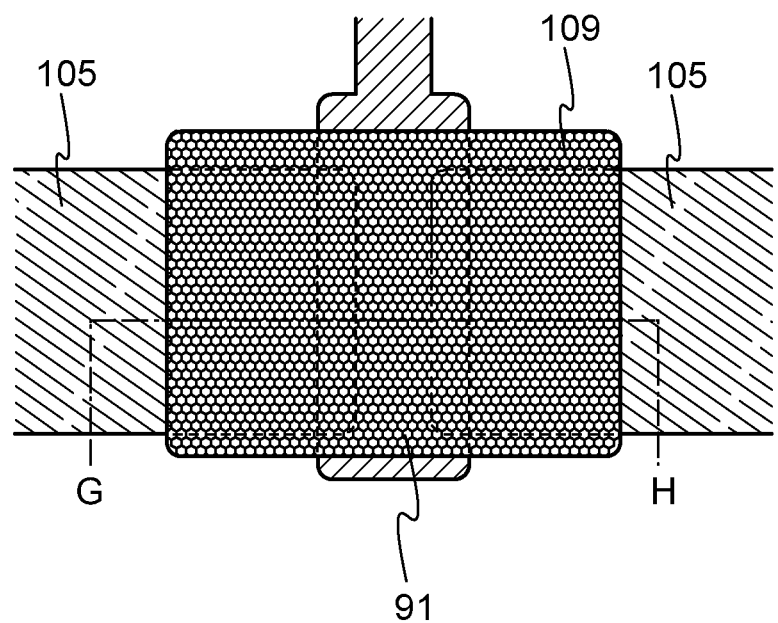
FIG. 10 is a top view illustrating a process for manufacturing a semiconductor device according to one embodiment of the present invention.

Next, as illustrated in FIG. 9D, a protective film 111 is formed over the crystalline oxide semiconductor film 109 and the pair of electrodes 105.

The protective film 111 can be formed in a manner similar to that of the gate insulating film 63 in Embodiment 1.

After that, heat treatment may be performed.

Through the above steps, a transistor having the crystalline oxide semiconductor film in a channel formation region can be formed. The crystalline oxide semiconductor film has a hexagonal crystal structure where bonds for forming hexagonal lattices are formed in the a-b plane and the c-axes are substantially perpendicular to a plan surface of the substrate which is substantially parallel to the a-b plane. Such a transistor including the crystalline oxide semiconductor film in the channel region has a small amount of change in the threshold voltage between before and after light irradiation or the BT test; thus, the transistor can have stable electric characteristics.

Note that this embodiment can be combined with any of the other embodiments, as appropriate.

Embodiment 5

In this embodiment, a case where the transistor described in any of Embodiments 1 to 4 has a plurality of gate electrodes will be described. Although the transistor described in Embodiment 3 is used in this embodiment, the transistors described in Embodiments 1, 2, and 4 can be used as appropriate.

Figure 11:
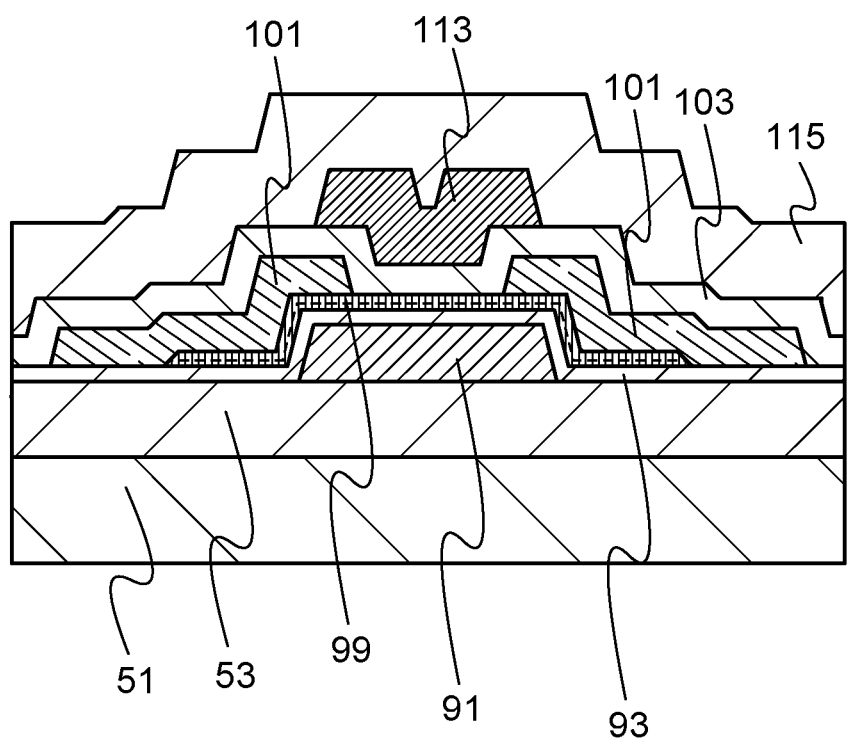
FIG. 11 is a cross-sectional view illustrating a process for manufacturing a semiconductor device according to one embodiment of the present invention.

As illustrated in FIG. 11, the oxide insulating film 53 is formed over the substrate 51; the gate electrode 91 and the gate insulating film 93 are formed over the oxide insulating film 53; and the crystalline oxide semiconductor film 99, the pair of electrodes 101, and the insulating film 103 are formed over the gate insulating film 93, as in Embodiment 3.

Next, a back gate electrode 113 is formed in a region which is above the insulating film 103 and overlaps with the crystalline oxide semiconductor film 99. Then, an insulating film 115 may be formed as a protective film over the insulating film 103 and the back gate electrode 113.

The back gate electrode 113 can be formed in a manner similar to that of the gate electrode 65 in Embodiment 1.

The insulating film 103 functions as a gate insulating film on the back gate electrode 113 side. The insulating film 115 can be formed in a manner similar to that of the insulating film 69 described in Embodiment 1.

The gate electrode 91 and the back gate electrode 113 may be connected. In this case, the gate electrode 91 and the back gate electrode 113 have the same potential and channel regions are formed on the gate insulating film 93 side and on the insulating film 103 side of the crystalline oxide semiconductor film 99, and thereby the on-state current and field effect mobility of the transistor can be increased.

Alternatively, it is also possible that the gate electrode 91 and the back gate electrode 113 are not connected and have different applied potentials. In this case, the threshold voltage of the transistor can be controlled.

In this embodiment, the pair of electrodes 101 is formed between the crystalline oxide semiconductor film 99 and the insulating film 103, but the pair of electrodes may be formed between the gate insulating film 93 and the crystalline oxide semiconductor film 99.

Through the above-described steps, the transistor having a plurality of gate electrodes can be formed.

Embodiment 6

In this embodiment, a manufacturing method of a transistor where a contact resistance between a crystalline oxide semiconductor film and a pair of electrodes can be decreased more than those of the transistors described in Embodiment 1 to Embodiment 5 will be described.

Figure 12A:
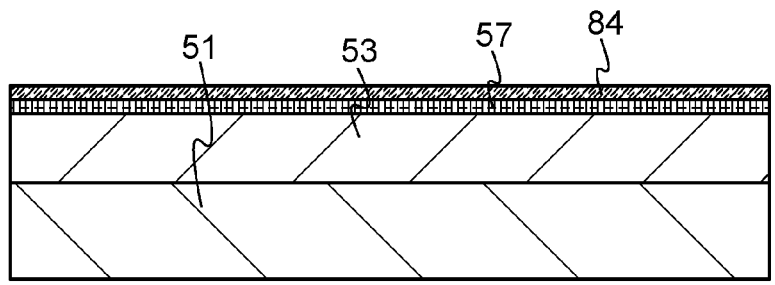
FIGS. 12A to 12E are cross-sectional views illustrating a process for manufacturing a semiconductor device according to one embodiment of the present invention.

As in Embodiment 1, the crystalline oxide semiconductor film 55 is formed over the oxide insulating film 53 by the steps described in FIGS. 1A and 1B. Next, the crystalline oxide semiconductor film 55 is heated to form the crystalline oxide semiconductor film with the lowered hydrogen concentration and the reduced oxygen vacancies. Then, as illustrated in FIG. 12A, a buffer 84 having n-type conductivity is formed over the crystalline oxide semiconductor film 57 with the lowered hydrogen concentration and the reduced oxygen vacancies.

For the buffer 84 having n-type conductivity, a metal oxide selected from the group of indium oxide, indium tin oxide, indium zinc oxide, tin oxide, zinc oxide, and tin zinc oxide, or a material of the metal oxide which contains one or more elements selected from the group of aluminum, gallium, and silicon can be used. With such a structure, the contact resistance between the crystalline oxide semiconductor film and the pair of electrodes serving as a source electrode and a drain electrode to be formed later can be reduced.

In this case, at the same time when the crystalline oxide semiconductor film is heated to release hydrogen from the crystalline oxide semiconductor film, oxygen is diffused into the crystalline oxide semiconductor film from the oxide insulating film. After that, the buffer 84 having n-type conductivity is formed over the crystalline oxide semiconductor film. That is, hydrogen can be sufficiently released from the oxide semiconductor film. As a result, the hydrogen concentration and the oxygen vacancy in the crystalline oxide semiconductor film can be reduced, and thereby the threshold voltage of the transistor can be prevented from shifting to a negative side.

Figure 12B:
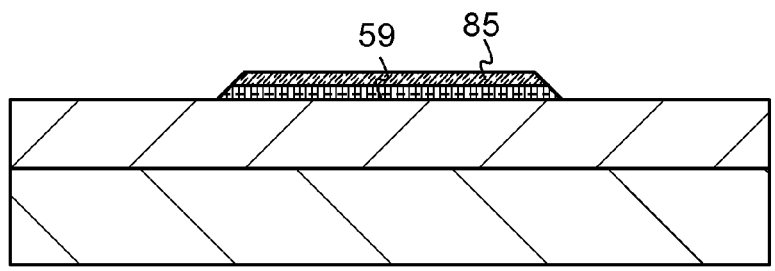

Next, after a mask is formed over the buffer 84 having n-type conductivity, the crystalline oxide semiconductor film with the lowered hydrogen concentration and the reduced oxygen vacancies and the buffer 84 having n-type conductivity are etched to form the crystalline oxide semiconductor film 59 and a buffer 85 having n-type conductivity. After that, the mask is removed (see FIG. 12B).

Figure 12C:
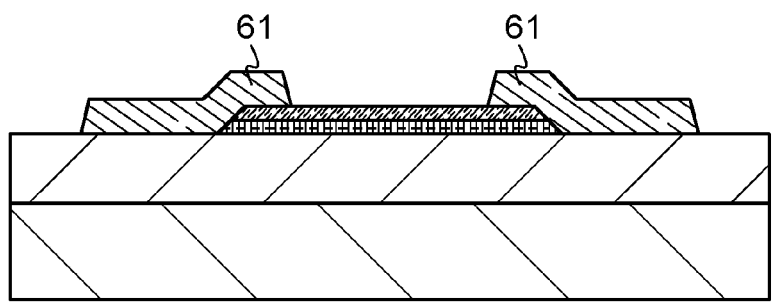
Figure 12D:
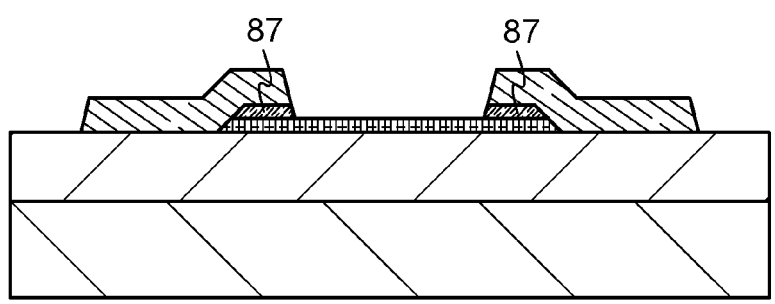

As illustrated in FIG. 12C, the pair of electrodes 61 is formed over the crystalline oxide semiconductor film 59 and the buffer 85 having n-type conductivity. In this case, in order to keep the film quality of the gate insulating film, a material which does not extract oxygen from the gate insulating film is preferably used as the pair of electrodes 61. Examples of the material of the pair of electrodes 61 include tungsten, molybdenum and the like. However, tungsten or molybdenum unfortunately turns into a highly-resistant metal oxide in a region in contact with the crystalline oxide semiconductor film and the gate insulating film. For that reason, the buffer having n-type conductivity is provided between the crystalline oxide semiconductor film 59 and the pair of electrodes 61 so that the contact resistance between the crystalline oxide semiconductor film 59 and the pair of electrodes 61 can be reduced (see FIG. 12D).

Next, with use of a mask (not illustrated) formed over the pair of electrodes 61, an exposed portion of the buffer 85 having n-type conductivity is etched to form a pair of buffers 87 having n-type conductivity.

Note that it is possible that after the mask formed over the pair of electrodes 61 is removed, the pair of electrodes 61 is used as a mask and an exposed portion of the buffer 85 having n-type conductivity is etched, so that the pair of buffers 87 having n-type conductivity is formed.

When the buffer 85 having n-type conductivity is etched, a condition that the crystalline oxide semiconductor film 59 is not etched and the buffer 85 having n-type conductivity is selectively etched (a condition with a high etching selectivity) is preferably adopted. In addition, if a difference in etching rates between the crystalline oxide semiconductor film 59 and the buffer 85 having n-type conductivity is small, the crystalline oxide semiconductor film 59 is partially etched into a shape having a groove (a depressed portion) as well as the buffer 85 having n-type conductivity.

In this embodiment, since the pair of the buffers 87 having n-type conductivity is provided between the crystalline oxide semiconductor film 59 and the pair of electrodes 61, the contact resistance between the crystalline oxide semiconductor film 59 and the pair of electrodes 61 can be lowered. As a result, an on-state current of the transistor can be prevented from being reduced. In addition, the amount of change in the on-state current (Ion deterioration) between before and after application of a negative gate stress in a BT test can be suppressed.

Figure 12E:
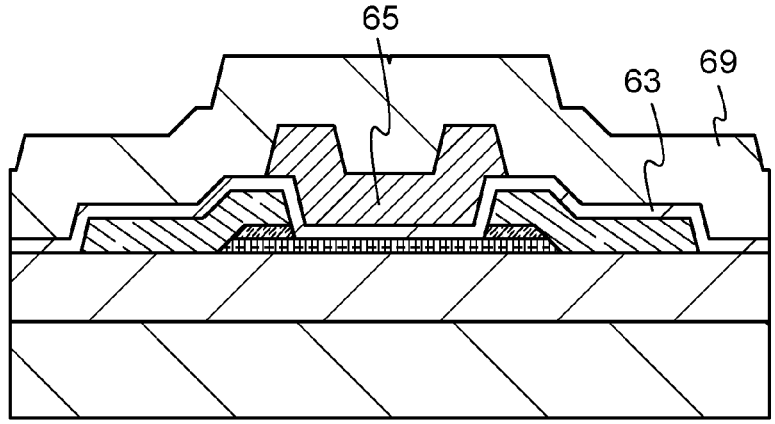

Next, as in Embodiment 1, the gate insulating film 63, the gate electrode 65 and the insulating film 69 are formed (see FIG. 12E). In addition, after contact holes are formed in the gate insulating film 63 and the insulating film 69, wirings connected to the pair of electrodes 61 may be formed.

Through the above steps, the transistor having the crystalline oxide semiconductor film in a channel formation region can be formed.

According to this embodiment, a buffer having n-type conductivity is formed between the oxide semiconductor film and a pair of wirings in order to reduce contact resistance, whereby the on-state current of the transistor can be reduced and the amount of change in the on-state current (Ion deterioration) between before and after application of a negative gate stress in a BT test can be suppressed.

Note that this embodiment can be combined with any of the other embodiments, as appropriate.

Embodiment 7

Figure 13:
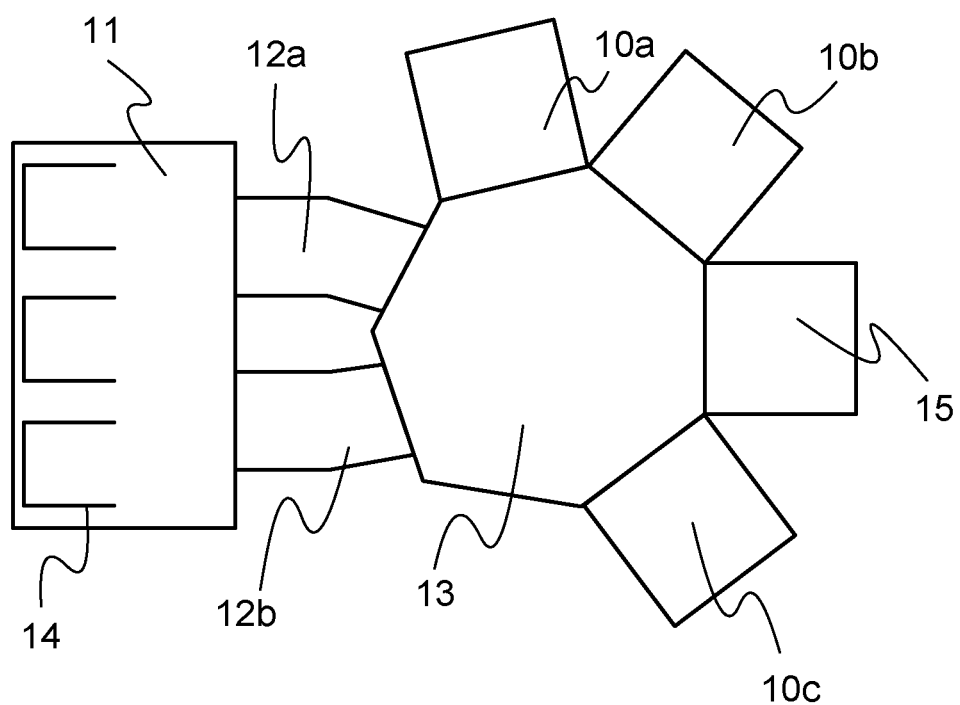
FIG. 13 is a top view illustrating an example of a manufacturing apparatus used to manufacture one embodiment of the present invention.

In this embodiment, an example of a manufacturing apparatus with which steps from formation of the oxide insulating film 53 to formation of a conductive film to be a source electrode or a drain electrode through a heat treatment step, which are described in Embodiment 1, are successively performed without exposure to air is illustrated in FIG. 13.

The manufacturing apparatus illustrated in FIG. 13 is a single wafer multi-chamber apparatus, which includes three sputtering devices 10a, 10b, and 10c, a substrate supply chamber 11 provided with three cassette ports 14 for holding a process substrate, load lock chambers 12a and 12b, a transfer chamber 13, a substrate heating chamber 15, and the like. Note that a transfer robot for transferring a substrate to be processed is provided in each of the substrate supply chamber 11 and the transfer chamber 13. The atmospheres of the sputtering devices 10a, 10b, and 10c, the transfer chamber 13, and the substrate heating chamber 15 are preferably controlled so as to hardly contain hydrogen and moisture (i.e., as an inert atmosphere, a reduced pressure atmosphere, or a dry air atmosphere). For example, a preferable atmosphere is a dry nitrogen atmosphere in which the dew point of moisture is −40° C. or lower, preferably −50° C. or lower.

An example of a procedure of the manufacturing steps with use of the manufacturing apparatus illustrated in FIG. 13 is as follows. The process substrate is transferred from the substrate supply chamber 11 to the substrate heating chamber 15 through the load lock chamber 12a and the transfer chamber 13; moisture attached to the process substrate is removed by heat treatment such as vacuum baking in the substrate heating chamber 15; the process substrate is transferred to the sputtering device 10c through the transfer chamber 13; and the oxide insulating film 53 is deposited in the sputtering device 10c. Then, the process substrate is transferred to the sputtering device 10a without exposure to air through the transfer chamber 13; zinc is preferentially deposited on the oxide insulating film 53 in the sputtering device 10a, and the deposited zinc is oxidized, so that the seed crystal 55a with a hexagonal crystal structure including zinc is formed; and sputtering is continuously performed in the same sputtering device, so that crystal growth is caused using the seed crystal 55a as a nucleus, and the crystalline oxide semiconductor film 55b with a hexagonal crystal structure is formed over the seed crystal 55a. Then, the process substrate is transferred to the substrate heating chamber 15 though the transfer chamber 13 without exposure to air and a heat treatment is performed. After that, the process substrate is transferred to the sputtering device 10b through the transfer chamber 13 without exposure to air; and a conductive film to be a source electrode and a drain electrode is deposited with use of a metal target over the crystalline oxide semiconductor film 55b in the sputtering device 10b.

As described above, with use of the manufacturing apparatus illustrated in FIG. 13, part of a manufacturing process of a transistor can proceed without exposure to air.

Note that this embodiment can be combined with any of the other embodiments, as appropriate.

Embodiment 8

In this embodiment, an example of a semiconductor device having a novel structure will be described. In this semiconductor device, the transistor including the oxide semiconductor layer described in any of Embodiments 1 to 7 is used, stored data can be retained even in a state where no power is supplied, and there is no limitation on the number of writing operations.

Since the off-state current of the transistor including an oxide semiconductor described in any one of Embodiments 1 to 7 is extremely small, stored data can be held for an extremely long time owing to such a transistor. In other words, power consumption can be adequately reduced because refresh operation becomes unnecessary or the frequency of refresh operation can be extremely low. Moreover, stored data can be held for a long time even when power is not supplied.

Figure 14A:
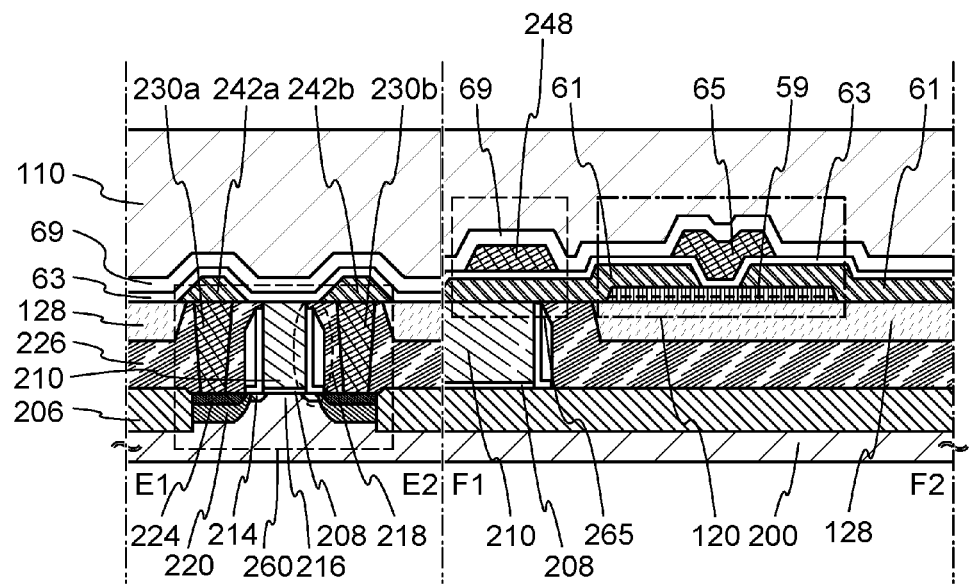
FIGS. 14A to 14C are a cross-sectional view, a top view, and a circuit diagram, respectively, illustrating one embodiment of the present invention.
Figure 14B:
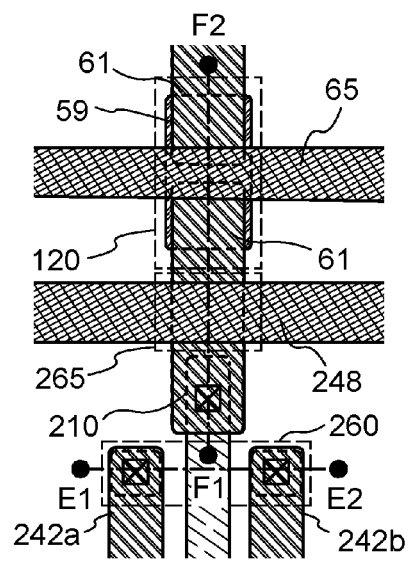
Figure 14C:
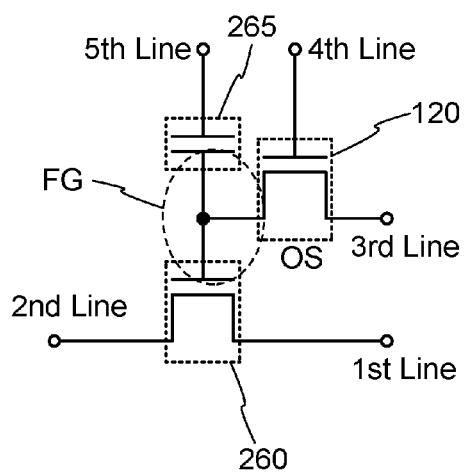

FIGS. 14A to 14C illustrate an example of a structure of a semiconductor device. FIG. 14A illustrates a cross section of the semiconductor device, and FIG. 14B illustrates a plan view of the semiconductor device. Here, FIG. 14A corresponds to a cross section along line E1-E2 and line F1-F2 in FIG. 14B. The semiconductor device illustrated in FIGS. 14A and 14B includes a transistor 260 including a material other than an oxide semiconductor in a lower portion, and a transistor 120 including an oxide semiconductor in an upper portion. The transistor 120 is the same as that in Embodiment 1; thus, for description of FIGS. 14A to 14C, the same reference numerals are used for the same parts as those in FIG. 1E.

The transistor 260 includes: a channel formation region 216 in a substrate 200 containing a semiconductor material (e.g., silicon or the like); impurity regions 214 and high-concentration impurity regions 220 (which are collectively called simply impurity regions and which are provided so that the channel formation region 216 is sandwiched therebetween); a gate insulating film 208 over the channel formation region 216; a gate electrode 210 over the gate insulating film 208; a source or drain electrode 230a electrically connected to the impurity region; and a source or drain electrode 230b electrically connected to the impurity region.

Here, sidewall insulating films 218 are formed on side surfaces of the gate electrode 210. The high-concentration impurity regions 220 are provided in regions of the substrate 200 which do not overlap with the sidewall insulating films 218 when seen from a direction perpendicular to a main surface of the substrate 200. Metal compound regions 224 are provided in contact with the high-concentration impurity regions 220. An element isolation insulating film 206 is provided over the substrate 200 so as to surround the transistor 260. An interlayer insulating film 226 and an interlayer insulating film 128 are provided so as to cover the transistor 260. The source or drain electrode 230a and the source or drain electrode 230b are electrically connected to the metal compound regions 224 through openings formed in the interlayer insulating films 226 and 128. In other words, the source or drain electrode 230a and the source or drain electrode 230b are electrically connected to the high-concentration impurity regions 220 and the impurity regions 214 through the metal compound regions 224. Note that the sidewall insulating film 218 is not formed in some cases for integration of the transistor 260 or the like.

The transistor 120 illustrated in FIGS. 14A to 14C includes the crystalline oxide semiconductor film 59, the pair of electrodes 61 serving as a source electrode or a drain electrode, the gate insulating film 63, and the gate electrode 65. The transistor 120 can be formed by the process described in Embodiment 1.

In FIGS. 14A to 14C, the crystalline oxide semiconductor film 59 can have a uniform thickness by improving the planarity of the interlayer insulating film 128 over which the crystalline oxide semiconductor film 59 is formed; thus, the characteristics of the transistor 120 can be improved. Note that the channel length is small, for example, 0.8 μm or 3 μm. Further, the interlayer insulating film 128 corresponds to the oxide insulating film 53 and is formed using the same material.

A capacitor 265 illustrated in FIGS. 14A to 14C includes one of the pair of electrodes 61, the gate insulating film 63 serving as a dielectric, and an electrode 248.

Further, the insulating film 69 is provided over the transistor 120 and the capacitor 265, and the protective insulating film 110 is provided over the insulating film 69.

Furthermore, a wiring 242a and a wiring 242b which are formed in the same step as that of the pair of electrodes 61 are provided. The wiring 242a is electrically connected to the source or drain electrode 230a, and the wiring 242b is electrically connected to the source or drain electrode 230b.

FIG. 14C shows a circuit configuration. Note that in the circuit diagram, in some cases, "OS" is written beside a transistor in order to indicate that the transistor includes an oxide semiconductor.

In FIG. 14C, a first wiring (a 1st Line) is electrically connected to the source electrode of the transistor 260, and a second wiring (a 2nd Line) is electrically connected to a drain electrode of the transistor 260. A third wiring (a 3rd Line) is electrically connected to one of the source electrode and the drain electrode of the transistor 120, and a fourth wiring (a 4th Line) is electrically connected to a gate electrode of the transistor 120. A gate electrode of the transistor 260, the other of the source electrode and the drain electrode of the transistor 120, and one electrode of the capacitor 265 are electrically connected to one another. Further, a fifth wiring (a 5th line) and the other electrode of the capacitor 265 are electrically connected to each other.

The semiconductor device in FIG. 14C can write, hold, and read data as described below, utilizing a characteristic in which the potential of the gate electrode of the transistor 260 can be held.

Firstly, writing and holding of data will be described. The potential of the fourth wiring is set to a potential at which the transistor 120 is turned on, whereby the transistor 120 is turned on. Thus, the potential of the third wiring is applied to the gate electrode of the transistor 260 and the capacitor 265. In other words, a predetermined charge is supplied to the gate electrode of the transistor 260 (i.e., writing of data). Here, charge for supply of a potential level or charge for supply of a different potential level (hereinafter referred to as Low level charge and High level charge) is given. After that, the potential of the fourth wiring is set to a potential at which the transistor 120 is turned off, so that the transistor 120 is turned off. Thus, the charge given to the gate electrode of the transistor 260 is held (holding).

The off-state current of the transistor 120 is extremely low. Specifically, the value of the off-state current (here, current per micrometer of channel width) is less than or equal to 100 zA/μm (1 zA (zeptoampere) is $1 \times 10^{-21}$ A), preferably less than or equal to 10 zA/μm. Thus, the charge of the gate electrode in the transistor 260 can be retained for a long time. In addition, a back gate electrode may be provided as described in Embodiment 5, and it is preferable that the transistor 120 be surely a normally off transistor by application of the voltage to the back gate electrode.

As the substrate 200, a semiconductor substrate called an SOI (silicon on insulator) substrate can be used. Alternatively, as the substrate 200, a substrate in which an SOI layer is formed over an insulating substrate such as a glass substrate may be used. As an example of a formation method of an SOI substrate in which an SOI layer is formed over a glass substrate, there is a method in which a thin single crystal layer is formed over a glass substrate by a hydrogen ion implantation separation method. Specifically, by irradiation with $H_3^+$ ions using an ion doping apparatus, a separation layer is formed in a silicon substrate at a predetermined depth from a surface, a glass substrate having an insulating film on its surface is bonded to the surface of the silicon substrate by being pressed, and a heat treatment is performed at a temperature which is lower than a temperature at which separation occurs in the separation layer or at an interface of the separation layer. Alternatively, the heating temperature may be a temperature at which the separation layer is embrittled. As a result, part of the semiconductor substrate is separated from the silicon substrate by generating a separation border in the separation layer or at an interface of the separation layer, so that the SOI layer is formed over the glass substrate.

Note that this embodiment can be combined with any of the Embodiments 1 to 7, as appropriate.

Embodiment 9

In this embodiment, an example in which at least part of a driver circuit and a transistor to be disposed in a pixel portion are formed over one substrate is described below.

The transistor to be disposed in the pixel portion is formed according to any one of Embodiments 1 to 7. Further, the transistor described in any of Embodiments 1 to 7 is an n-channel TFT, and thus a part of a driver circuit that can be formed of n-channel TFTs among driver circuits is formed over the same substrate as the transistor of the pixel portion.

Figure 15A:
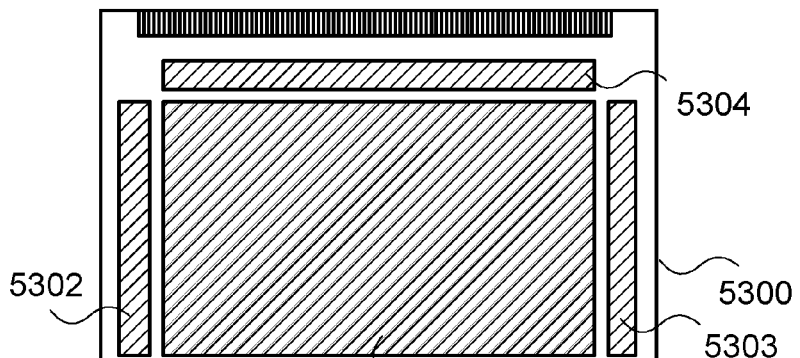
FIG. 15A is a block diagram illustrating one embodiment of the present invention and FIGS. 15B and 15C are equivalent circuit diagrams thereof.

FIG. 15A illustrates an example of a block diagram of an active matrix display device. Over a substrate 5300 in the display device, a pixel portion 5301, a first scan line driver circuit 5302, a second scan line driver circuit 5303, and a signal line driver circuit 5304 are provided. In the pixel portion 5301, a plurality of signal lines extended from the signal line driver circuit 5304 is arranged and a plurality of scan lines extended from the first scan line driver circuit 5302 and the second scan line driver circuit 5303 is arranged. Note that pixels which include display elements are arranged in matrix in regions where the scan lines and the signal lines are crossed. Further, the substrate 5300 in the display device is connected to a timing control circuit (also referred to as a controller or a controller IC) through a connection point such as a flexible printed circuit (FPC).

In FIG. 15A, the first scan line driver circuit 5302, the second scan line driver circuit 5303, and the signal line driver circuit 5304 are formed over the same substrate 5300 as the pixel portion 5301. Accordingly, the number of components of a drive circuit which is provided outside and the like are reduced, so that reduction in cost can be achieved. Further, if the driver circuit is provided outside the substrate 5300, wirings would need to be extended and the number of wiring connections would be increased, but if the driver circuit is provided over the substrate 5300, the number of wiring connections can be reduced. Consequently, improvement in reliability and yield can be achieved.

Figure 15B:
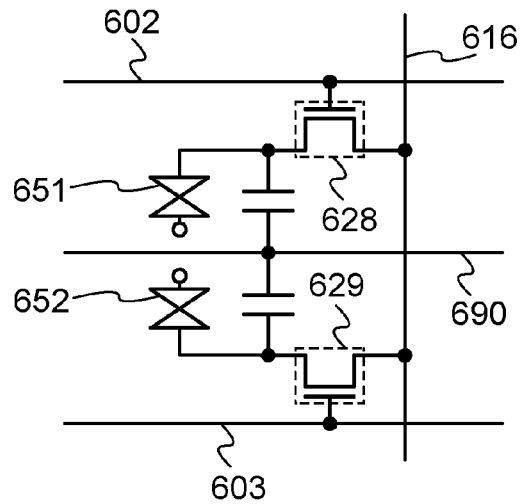

FIG. 15B illustrates an example of a circuit configuration of the pixel portion. Here, a pixel structure of a VA liquid crystal display panel is shown.

In this pixel structure, a plurality of pixel electrodes are included in one pixel, and transistors are connected to the respective pixel electrodes. The plurality of transistors are constructed so as to be driven by different gate signals. That is, signals that are applied to individual pixel electrodes in a multi-domain pixel are controlled independently of each other.

A gate wiring 602 of a transistor 628 and a gate wiring 603 of a transistor 629 are separated so that different gate signals can be given thereto. In contrast, the source or the drain electrode 616 functioning as a data line is used in common for the transistors 628 and 629. As each of the transistors 628 and 629, any of the transistors described in Embodiments 1 to 7 can be used as appropriate.

A first pixel electrode electrically connected to the transistor 628 and a second pixel electrode electrically connected to the transistor 629 have different shapes and are separated by a slit. The second pixel electrode is provided so as to surround the external side of the first pixel electrode which is spread in a V shape. Timing of voltage application is made to vary between the first and second pixel electrodes by the transistors 628 and 629 in order to control alignment of the liquid crystal. The transistor 628 is connected to the gate wiring 602, and the transistor 629 is connected to the gate wiring 603. When different gate signals are supplied to the gate wiring 602 and the gate wiring 603, operation timings of the transistor 628 and the transistor 629 can be varied.

Further, a storage capacitor is formed using a capacitor wiring 690, a gate insulating film serving as a dielectric, and a capacitor electrode electrically connected to the first pixel electrode layer or the second pixel electrode layer.

The first pixel electrode, a liquid crystal layer, and a counter electrode overlap with each other to form a first liquid crystal element 651. In addition, a second liquid crystal element 652 is formed by overlapping the second pixel electrode, the liquid crystal layer, and the counter electrode. The pixel structure is a multi-domain structure in which the first liquid crystal element 651 and the second liquid crystal element 652 are provided in one pixel.

Note that the pixel structure is not limited to that illustrated in FIG. 15B. For example, a switch, a resistor, a capacitor, a transistor, a sensor, a logic circuit, or the like may be added to the pixel illustrated in FIG. 15B.

Figure 15C:
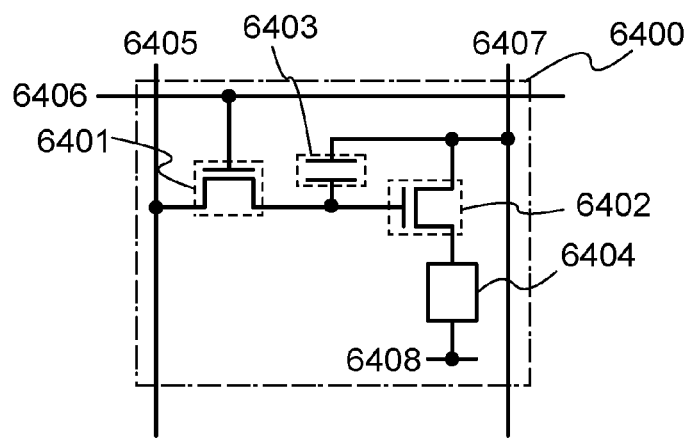

FIG. 15C shows an example of a circuit configuration of the pixel portion. Here, a pixel structure of a display panel using an organic EL element is shown.

In an organic EL element, by application of voltage to a light-emitting element, electrons and holes are separately injected from a pair of electrodes into a layer containing a light-emitting organic compound, and current flows. The carriers (electrons and holes) are recombined, and thus, the light-emitting organic compound is excited. The light-emitting organic compound returns to a ground state from the excited state, thereby emitting light. Owing to such a mechanism, this light-emitting element is referred to as a current-excitation light-emitting element.

FIG. 15C shows an example of a pixel structure to which digital time grayscale driving can be applied, as an example of a semiconductor device.

A structure and operation of a pixel to which digital time grayscale driving can be applied are described. Here, one pixel includes two n-channel transistors each of which includes an oxide semiconductor layer as a channel formation region.

A pixel 6400 includes a switching transistor 6401, a driver transistor 6402, a light-emitting element 6404, and a capacitor 6403. A gate electrode of the switching transistor 6401 is connected to a scan line 6406. A first electrode (one of a source electrode and a drain electrode) of the switching transistor 6401 is connected to a signal line 6405. A second electrode (the other of the source electrode and the drain electrode) of the switching transistor 6401 is connected to a gate electrode of the driving transistor 6402. The gate electrode of the driving transistor 6402 is connected to a power supply line 6407 through the capacitor 6403. A first electrode of the driving transistor 6402 is connected to the power supply line 6407. A second electrode of the driving transistor 6402 is connected to a first electrode (a pixel electrode) of the light-emitting element 6404. A second electrode of the light-emitting element 6404 corresponds to a common electrode 6408. The common electrode 6408 is electrically connected to a common potential line provided over the same substrate.

The second electrode (common electrode 6408) of the light-emitting element 6404 is set to a low power supply potential. Note that the low power supply potential is a potential satisfying that the low power supply potential is lower than a high power supply potential with reference to the high power supply potential that is set to the power supply line 6407. As the low power supply potential, GND, 0 V, or the like may be employed, for example. A potential difference between the high power supply potential and the low power supply potential is applied to the light-emitting element 6404 and current is supplied to the light-emitting element 6404, so that the light-emitting element 6404 emits light. Here, in order to make the light-emitting element 6404 emit light, each potential is set so that the potential difference between the high power supply potential and the low power supply potential is a forward threshold voltage or higher of the light-emitting element 6404.

Note that the capacitor 6403 can be omitted by using gate capacitance of the driver transistor 6402. The gate capacitance of the driving transistor 6402 may be formed between the channel formation region and the gate electrode.

In the case of a voltage-input voltage driving method, a video signal is input to the gate electrode of the driver transistor 6402 so that the driver transistor 6402 is either substantially turned on or substantially turned off. That is, the driver transistor 6402 operates in a linear region. That is, the driving transistor 6402 operates in a linear region, and thus, voltage higher than the voltage of the power supply line 6407 is applied to the gate electrode of the driving transistor 6402. Note that a voltage higher than or equal to voltage that is the sum of the voltage of the power supply line and Vth of the driver transistor 6402 is applied to the signal line 6405.

In the case of using an analog grayscale method instead of the digital time grayscale method, the same pixel structure as in FIG. 15C can be employed by inputting signals in a different way.

In the case of performing analog grayscale driving, a voltage greater than or equal to the sum of the forward voltage of the light-emitting element 6404 and Vth of the driving transistor 6402 is applied to the gate electrode of the driving transistor 6402. The forward voltage of the light-emitting element 6404 indicates a voltage at which a desired luminance is obtained, and includes at least forward threshold voltage. The video signal by which the driver transistor 6402 operates in a saturation region is input, so that current can be supplied to the light-emitting element 6404. In order for the driver transistor 6402 to operate in the saturation region, the potential of the power supply line 6407 is set higher than the gate potential of the driver transistor 6402. When an analog video signal is used, it is possible to feed current in accordance with the video signal to the light-emitting element 6404 and perform analog grayscale driving.

Note that the pixel structure is not limited to that illustrated in FIG. 15C. For example, a switch, a resistor, a capacitor, a sensor, a transistor, a logic circuit, or the like may be added to the pixel illustrated in FIG. 15C.

Embodiment 10

A semiconductor device disclosed in this specification can be applied to a variety of electronic devices (including game machines). Examples of electronic devices are a television set (also referred to as a television or a television receiver), a monitor of a computer or the like, a camera such as a digital camera or a digital video camera, a digital photo frame, a mobile phone handset (also referred to as a mobile phone or a mobile phone device), a portable game machine, a portable information terminal, an audio reproducing device, a large-sized game machine such as a pachinko machine, and the like. Examples of electronic devices each including the semiconductor device described in any of the above embodiments will be described.

Figure 16A:
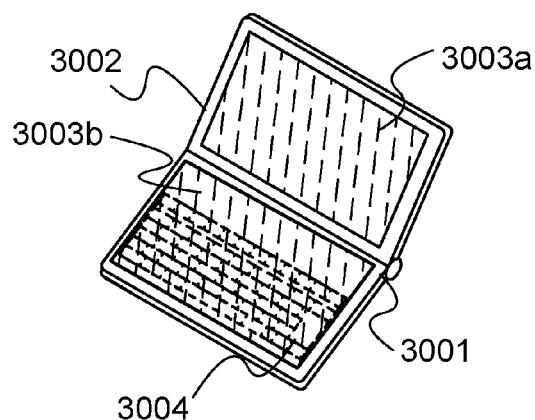
FIGS. 16A to 16D are external views of electronic devices each illustrating one embodiment of the present invention.

FIG. 16A illustrates a portable information terminal, which includes s main body 3001, a housing 3002, display portions 3003a and 3003b, and the like. The display portion 3003b functions as a touch panel. By touching keyboard buttons 3004 displayed on the display portion 3003*b*, a screen can be operated, and text can be input. Needless to say, the display portion 3003*a* may functions as a touch panel. A liquid crystal panel or an organic light-emitting panel is manufactured by using the transistor described in Embodiment 1 as a switching element and applied to the display portion 3003*a* or 3003*b*, whereby a highly reliable portable information terminal can be provided.

The portable information terminal illustrated in FIG. 16A has a function of displaying various kinds of information (e.g., a still image, a moving image, and a text image) on the display portion, a function of displaying a calendar, a date, the time, or the like on the display portion, a function of operating or editing the information displayed on the display portion, a function of controlling processing by various kinds of software (programs), and the like. Furthermore, an external connection terminal (an earphone terminal, a USB terminal, or the like), a recording medium insertion portion, and the like may be provided on the back surface or the side surface of the housing.

The portable information terminal illustrated in FIG. 16A may transmit and receive data wirelessly. Through wireless communication, desired book data or the like can be purchased and downloaded from an electronic book server.

Figure 16B:
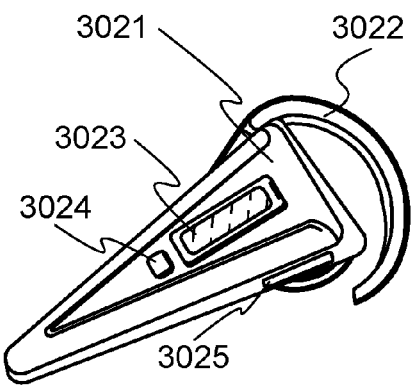

FIG. 16B illustrates a portable music player, which includes, in a main body 3021, a display portion 3023, a fixing portion 3022 with which the main body is worn on the ear, a speaker, an operation button 3024, an external memory slot 3025, and the like. A liquid crystal panel or an organic light-emitting panel is manufactured by using the transistor described in Embodiment 1 as a switching element and applied to the display portion 3023, whereby a highly reliable portable music player (PDA) can be provided.

Furthermore, when the portable music player illustrated in FIG. 16B functions as an antenna, a microphone, or a wireless communication device and is used with the mobile phone, a user can talk wirelessly and hands-freely on the phone while driving a car or the like.

Figure 16C:
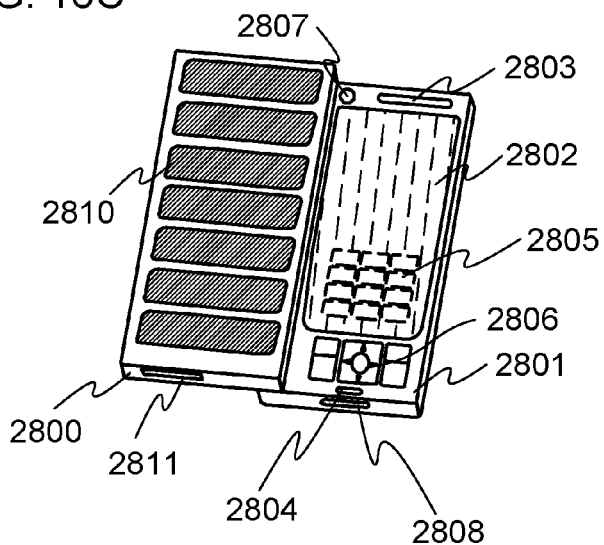

FIG. 16C illustrates a mobile phone, which includes two housings, a housing 2800 and a housing 2801. The housing 2801 includes a display panel 2802, a speaker 2803, a microphone 2804, a pointing device 2806, a camera lens 2807, an external connection terminal 2808, and the like. In addition, the housing 2800 includes a solar cell 2810 having a function of charge of the portable information terminal, an external memory slot 2811, and the like. Further, an antenna is incorporated in the housing 2801. The transistor described in Embodiment 1 is applied to the display panel 2802, whereby a highly reliable mobile phone can be provided.

Further, the display panel 2802 is provided with a touch panel. A plurality of operation keys 2805 that are displayed as images are shown by dashed lines in FIG. 16C. Note that a boosting circuit by which a voltage output from the solar cell 2810 is increased to be sufficiently high for each circuit is also included.

For example, a power transistor used in a power supply circuit such as a boosting circuit can be formed by employing the transistor 120 described in Embodiment 1, which includes the crystalline oxide semiconductor film 59 whose thickness is greater than or equal to 2 μm and less than or equal to 50 μm.

In the display panel 2802, the display direction can be appropriately changed depending on a usage pattern. Further, the display device is provided with the camera lens 2807 on the same surface as the display panel 2802, and thus it can be used as a video phone. The speaker 2803 and the microphone 2804 can be used for videophone calls, recording and playing sound, and the like as well as voice calls. Further, the housings 2800 and 2801 in a state where they are developed as illustrated in FIG. 16C can shift by sliding so that one is lapped over the other; therefore, the size of the mobile phone can be reduced, which makes the mobile phone suitable for being carried.

The external connection terminal 2808 can be connected to an AC adapter and various types of cables such as a USB cable, and charging and data communication with a personal computer are possible. Moreover, a large amount of data can be stored by inserting a storage medium into the external memory slot 2811 and can be moved.

Further, in addition to the above functions, an infrared communication function, a television reception function, or the like may be provided.

Figure 16D:
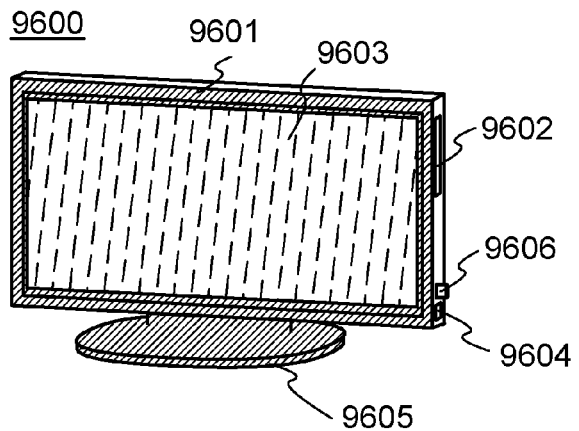
Figure 17:
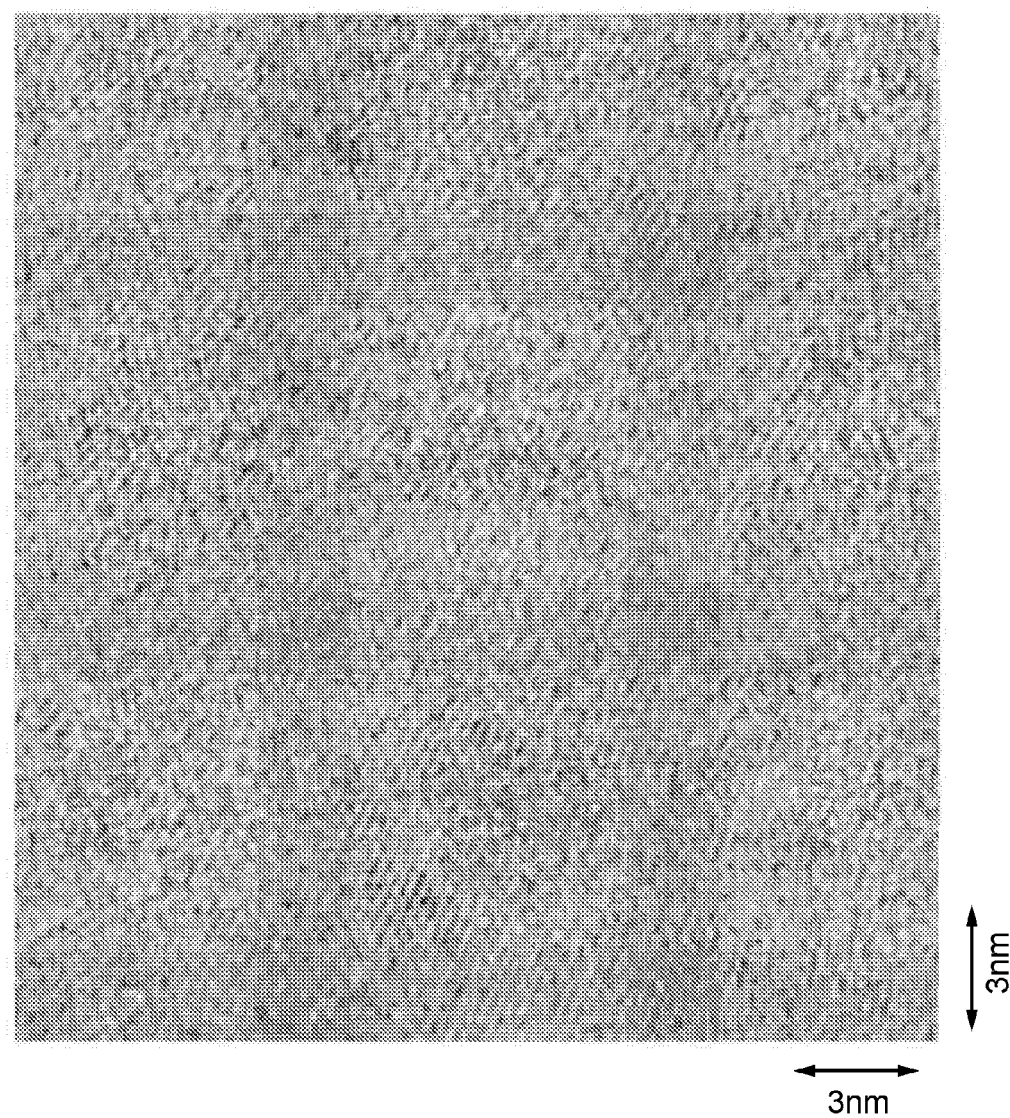
FIG. 17 is a plan TEM image.
Figure 18:
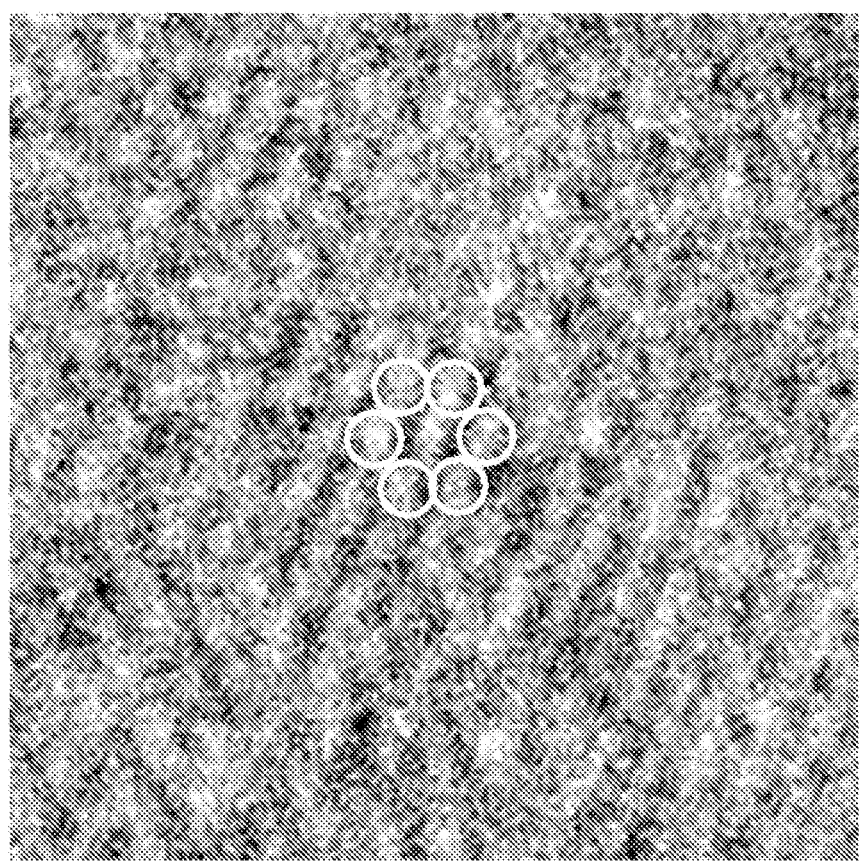
FIG. 18 is an enlarged image of part of FIG. 17, in which one of a hexagonal shape is shown by a white line.
Figure 19:
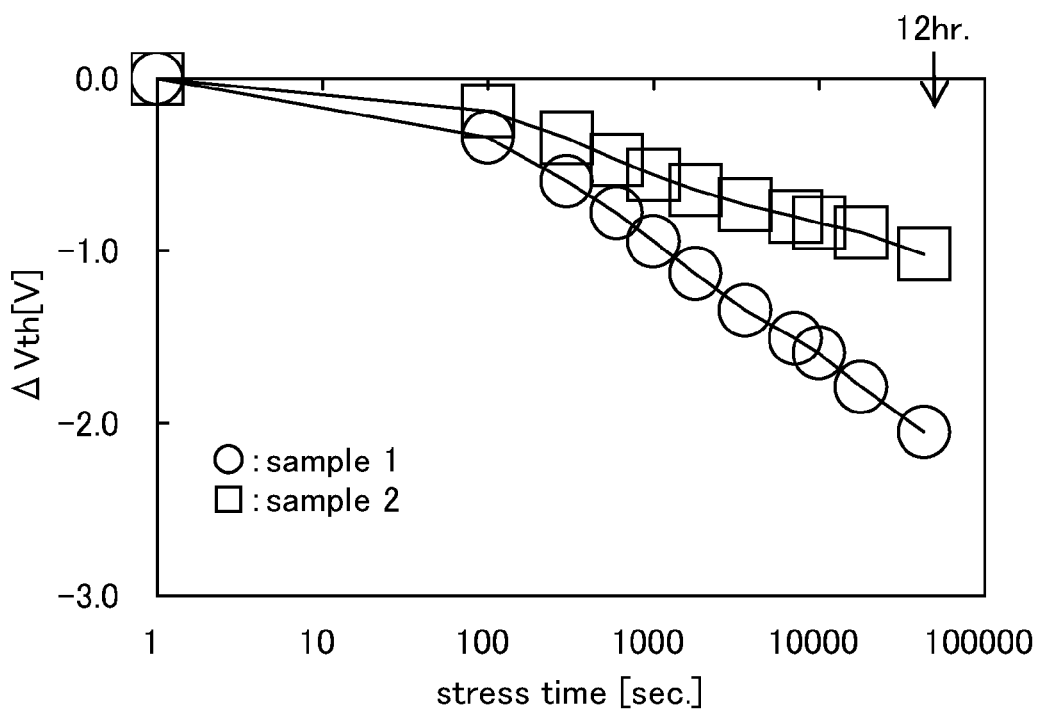
FIG. 19 is a graph for describing negative-bias temperature stress.
Figure 20A:
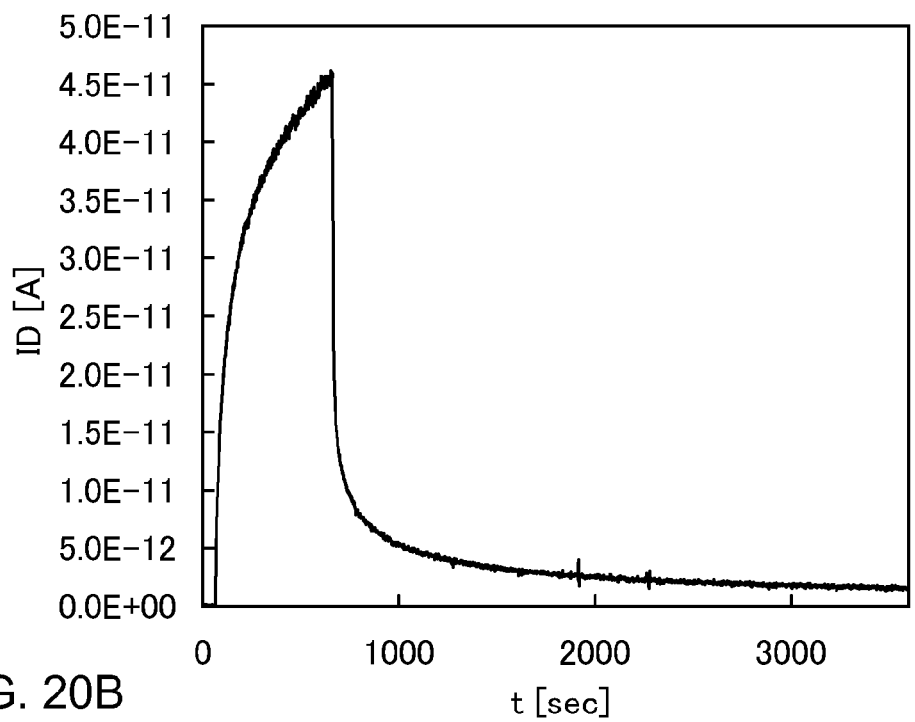
FIGS. 20A and 20B are graphs for describing time dependence of photocurrent.
Figure 20B:
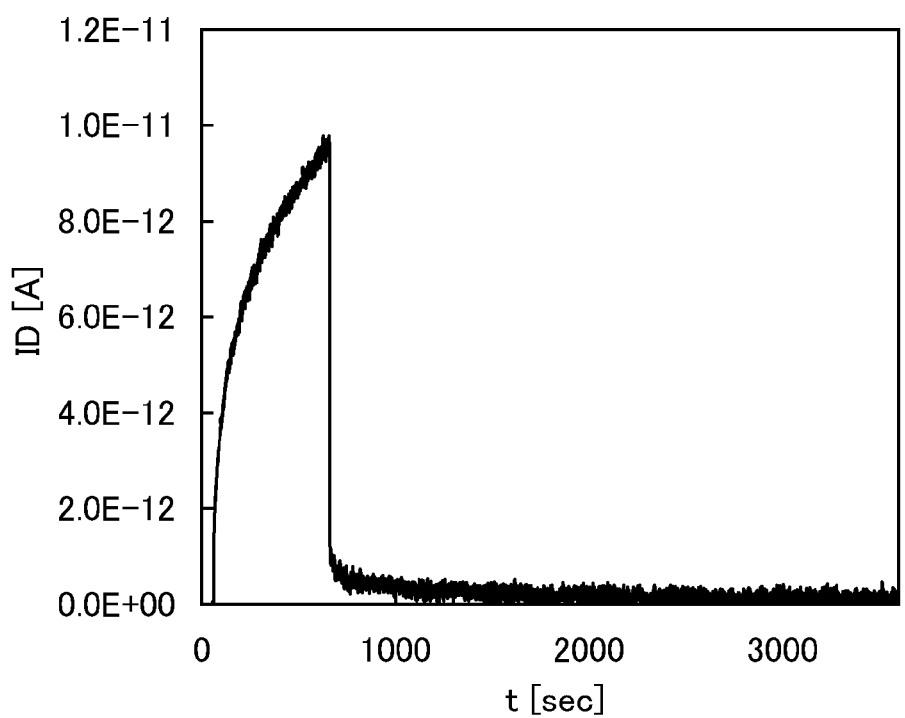
Figure 21:
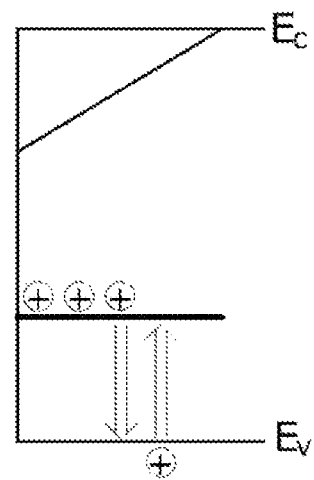
FIG. 21 is a schematic diagram showing a donor level.
Figure 22:
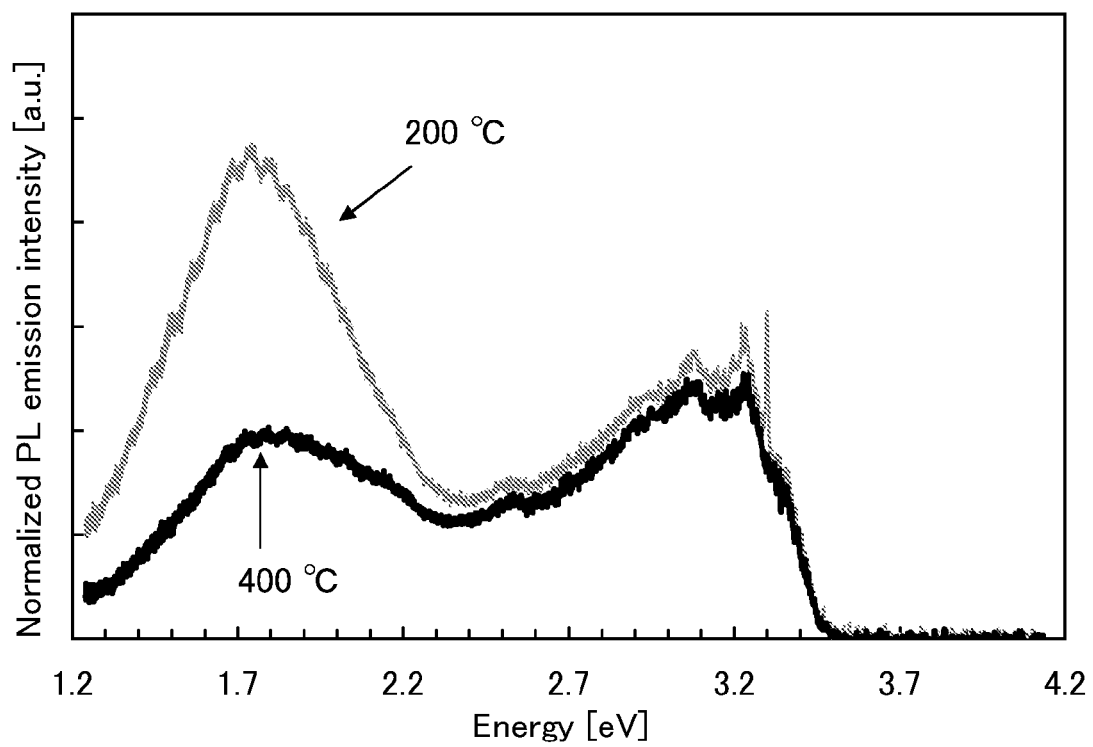
FIG. 22 is a graph showing measurement results of low-temperature PL.
Figure 23A:
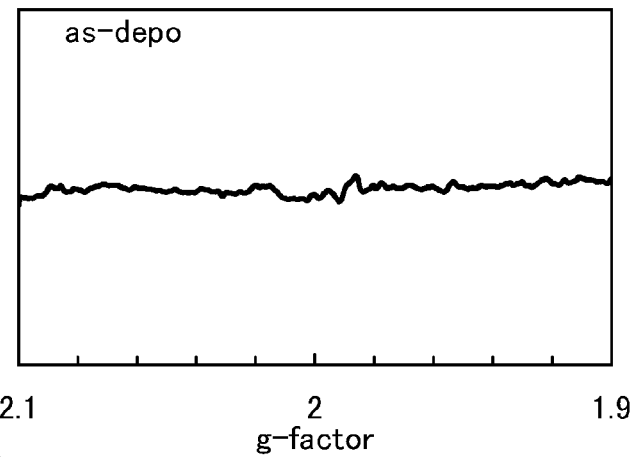
FIGS. 23A to 23C are graphs showing results of ESR measurement.
Figure 23B:
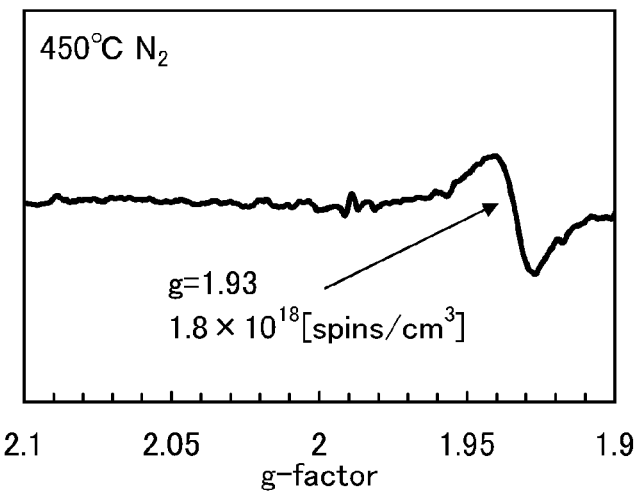
Figure 23C:
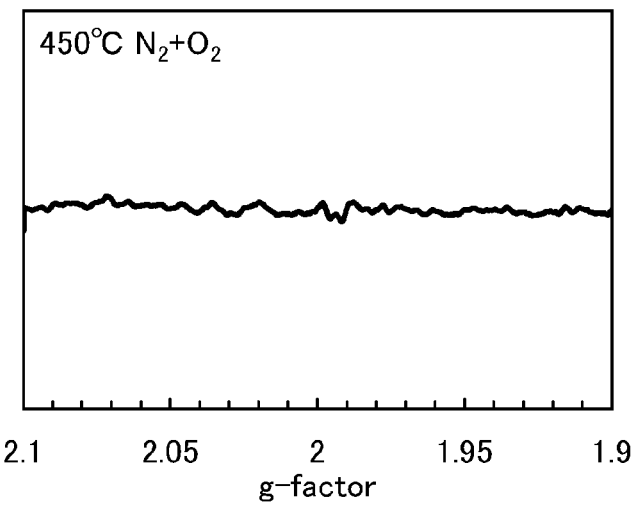
Figure 24:
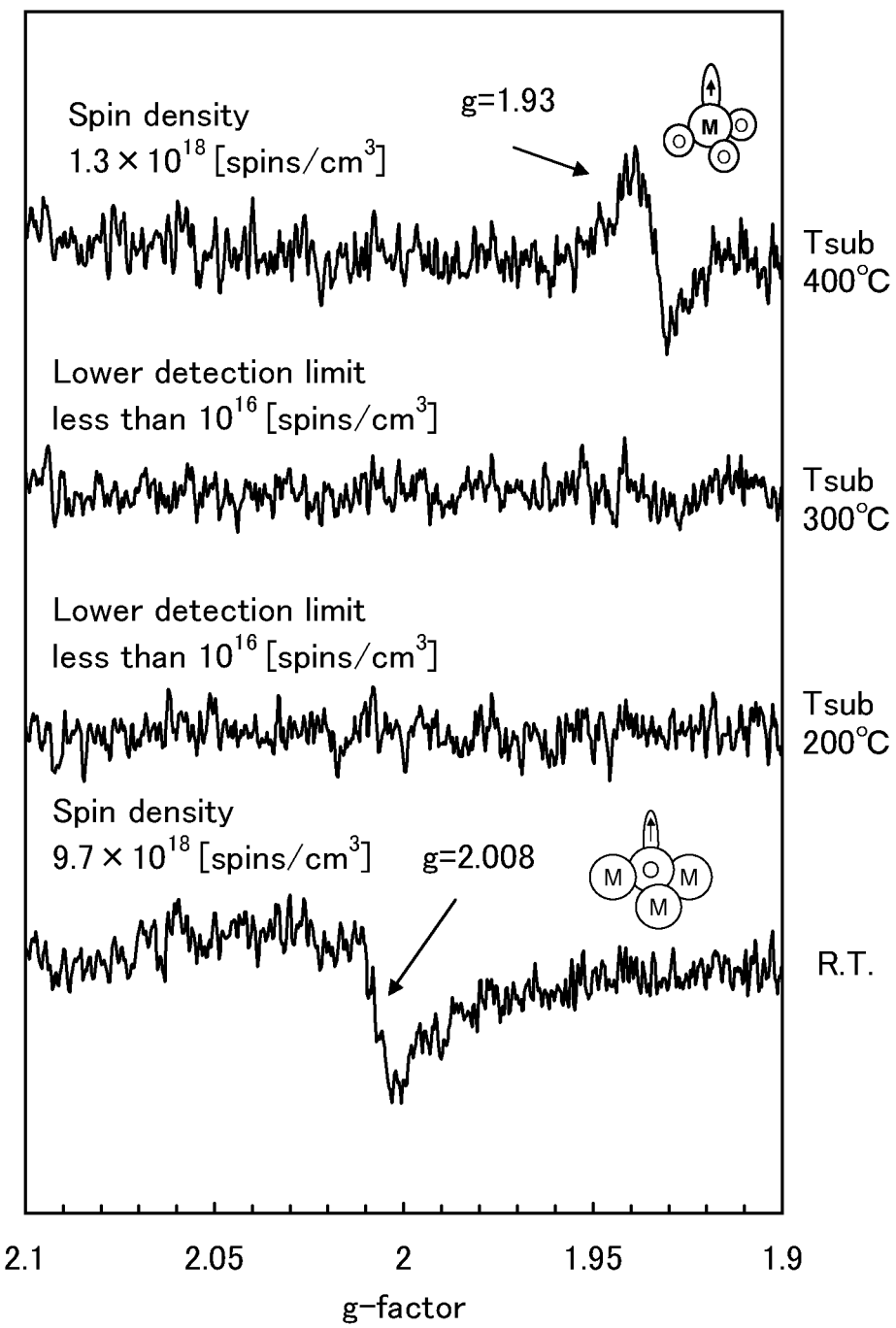
FIG. 24 is a graph showing results of ESR measurement.
Figure 25:
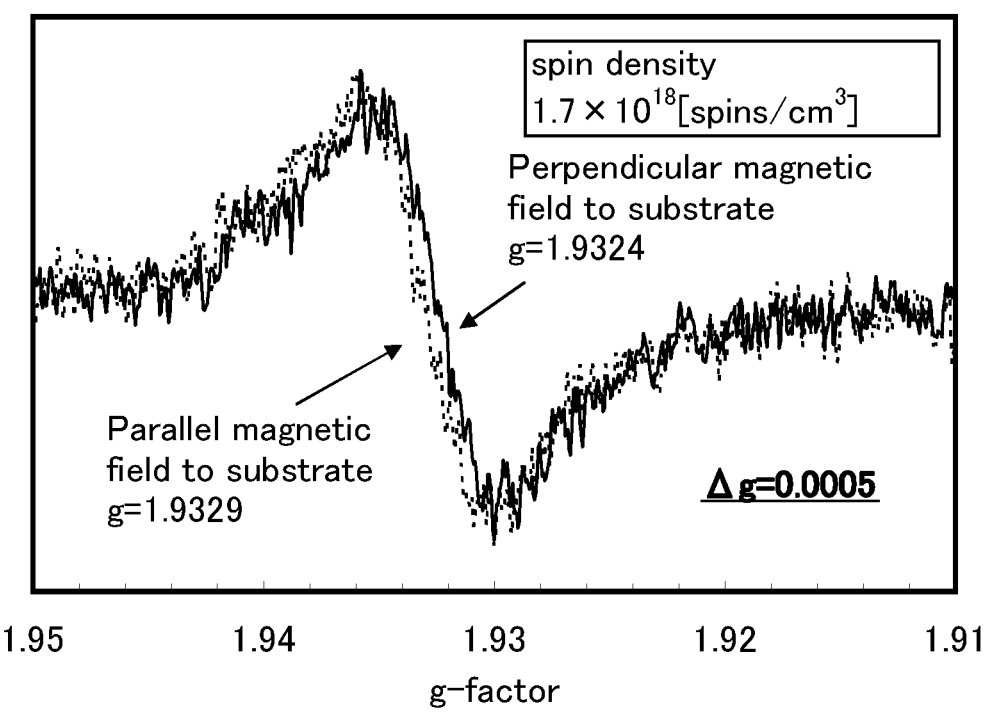
FIG. 25 is a graph showing results of ESR measurement.
Figure 26:
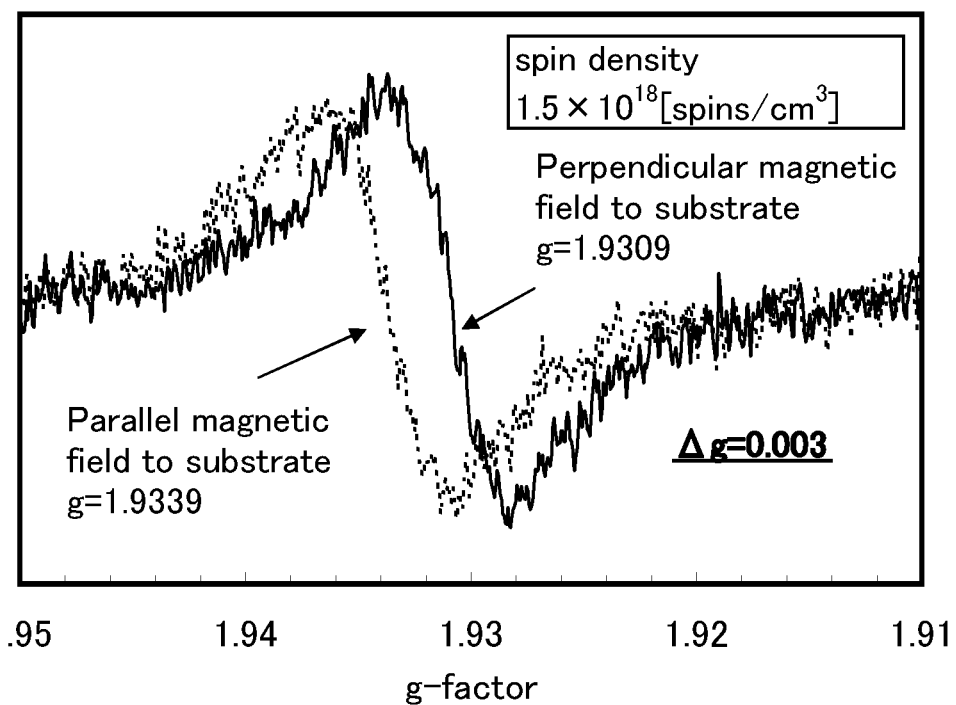
FIG. 26 is a graph showing results of ESR measurement.
Figure 27:
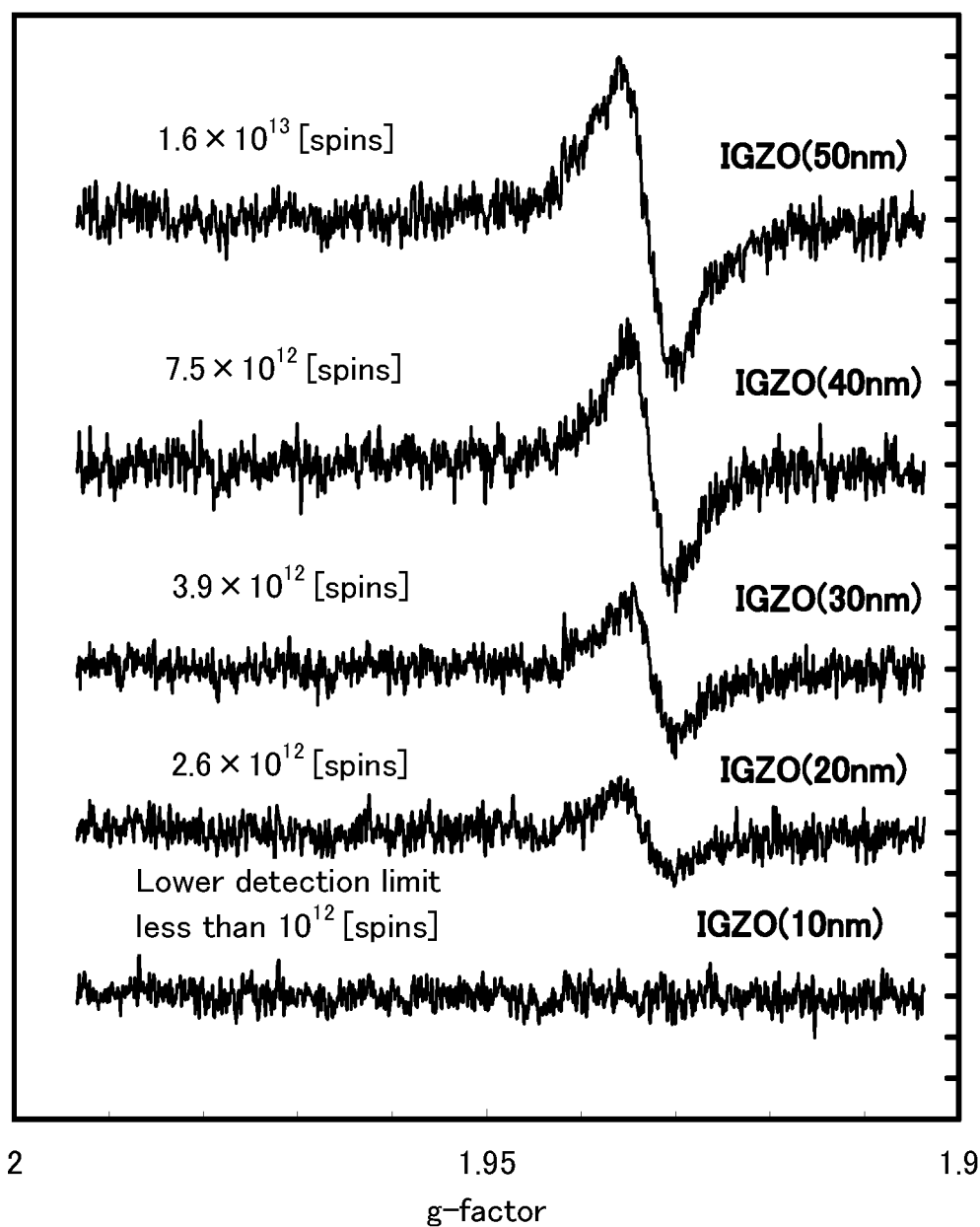
FIG. 27 is a graph showing results of ESR measurement.
Figure 28:
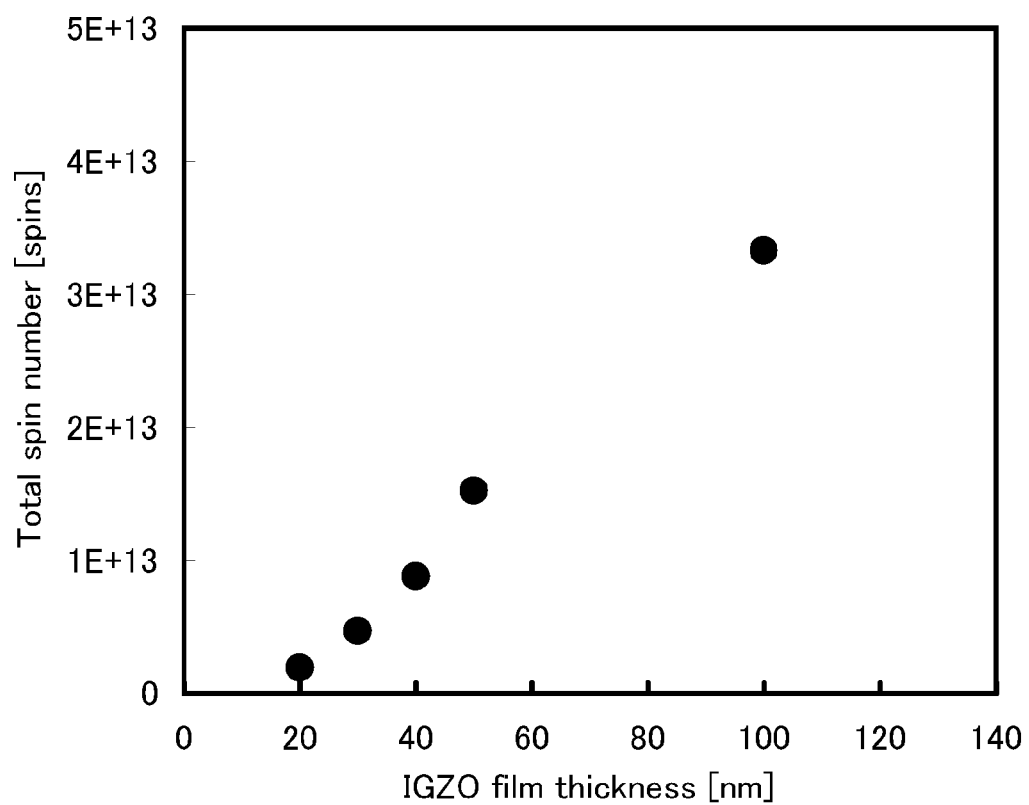
FIG. 28 is a graph showing results of ESR measurement.

FIG. 16D illustrates an example of a television set. In a television set 9600, a display portion 9603 is incorporated in a housing 9601. The display portion 9603 can display images. Here, the housing 9601 is supported on a stand 9605 provided with a CPU. When the transistor shown in Embodiment 1 is applied to the display portion 9603, the television set 9600 with high reliability can be obtained.

The television set 9600 can be operated by an operation switch of the housing 9601 or a separate remote controller. Further, the remote controller may be provided with a display portion for displaying data output from the remote controller.

Note that the television set 9600 is provided with a receiver, a modem, and the like. With use of the receiver, general television broadcasting can be received. Moreover, when the display device is connected to a communication network with or without wires via the modem, one-way (from a sender to a receiver) or two-way (between a sender and a receiver or between receivers) information communication can be performed.

Further, the television set 9600 is provided with an external connection terminal 9604, a storage medium recording and reproducing portion 9602, and an external memory slot. The external connection terminal 9604 can be connected to various types of cables such as a USB cable, and data communication with a personal computer is possible. A disk storage medium is inserted into the storage medium recording and reproducing portion 9602, and reading data stored in the storage medium and writing data to the storage medium can be performed. In addition, a picture, a video, or the like stored as data in an external memory 9606 inserted to the external memory slot can be displayed on the display portion 9603.

When the semiconductor device described in Embodiment 8 is applied to the external memory 9606 or a CPU, the television set 9600 can have high reliability and power consumption thereof is sufficiently reduced.

EXPLANATION OF REFERENCES

11: substrate supply chamber, 13: transfer chamber, 14: cassette port, 15: substrate heating chamber, 31: treatment chamber, 33: evacuation unit, 35: gas supply unit, 37: power supply device, 40: substrate support, 41: target, 43: ion, 51: substrate, 53: oxide insulating film, 55: crystalline oxide semiconductor film, 57: crystalline oxide semiconductor film, 59: crystalline oxide semiconductor film, 61: electrode, 63: gate insulating film, 65: gate electrode, 69: insulating film, 71: electrode, 73: crystalline oxide semiconductor film, 75: crystalline oxide semiconductor film, 77: gate insulating film, 79: gate electrode, 81: insulating film, 83: wiring, 84: buffer, 85: buffer, 87: buffer, 91: gate electrode, 93: gate insulating film, 95: crystalline oxide semiconductor film, 99: crystalline oxide semiconductor film, 101: electrode, 103: insulating film, 105:

electrode, 107: crystalline oxide semiconductor film, 109: crystalline oxide semiconductor film, 10a: sputtering apparatus, 10b: sputtering apparatus, 10c: sputtering apparatus, 110: protective insulating film, 111: protective film, 113: back gate electrode, 115: insulating film, 120: transistor, 128: interlayer insulating film, 12a: load lock chamber, 200: substrate, 206: isolation insulating film, 208: gate insulating film, 210: gate electrode, 214: impurity region, 216: channel formation region, 218: sidewall insulating film, 220: high-concentration impurity region, 224: metal compound region, 226: interlayer insulating film, 248: electrode, 260: transistor, 265: capacitor, 55a: seed crystal, 55b: crystalline oxide semiconductor film, 602: gate wiring, 603: gate wiring, 616: source electrode or drain electrode, 628: transistor, 629: transistor, 651: liquid crystal element, 652: liquid crystal element, 690: capacitor wiring, 230a: source electrode or drain electrode, 230b: source electrode or drain electrode, 242a: wiring, 242b: wiring, 2800: housing, 2801: housing, 2802: display panel, 2803: speaker, 2804: microphone, 2805: operation key, 2806: pointing device, 2807: camera lens, 2808: external connection terminal, 2810: solar cell, 2811: external memory slot, 3001: main body, 3002: housing, 3004: keyboard button, 3021: main body, 3022: fixing portion, 3023: display portion, 3024: operation button, 3025: external memory slot, 5300: substrate, 5301: pixel portion, 5302: scan line driver circuit, 5303: scan line driver circuit, 5304: signal line driver circuit, 6400: pixel, 6401: switching transistor, 6402: driver transistor, 6403: capacitor, 6404: light-emitting element, 6405: signal line, 6406: scan line, 6407: power supply line, 6408: common electrode, 9600: television set, 9601: housing, 9602: storage medium recording and reproducing portion, 9603: display portion, 9604: external connection terminal, 9605: stand, 9606: external memory, 3003a: display portion, 3003b: display portion This application is based on Japanese Patent Application serial No. 2010-204971 filed with Japan Patent Office on Sep. 13, 2010, the entire contents of which are hereby incorporated by reference.

The invention claimed is:

1. A method for manufacturing a semiconductor device, comprising the steps of:
    forming a gate electrode over a substrate;
    forming a gate insulating film comprising an oxide insulating film over the gate electrode;
    forming a seed crystal with a hexagonal crystal structure including zinc by a sputtering method over the gate insulating film;
    causing a crystal growth using the seed crystal as a nucleus while depositing indium over the seed crystal to form a crystalline oxide semiconductor film having a hexagonal crystal structure;
    performing a heat treatment on the crystalline oxide semiconductor film;
    etching the crystalline oxide semiconductor film after the heat treatment; and
    forming a pair of electrodes over the crystalline oxide semiconductor film after the etching step.

2. The method for manufacturing a semiconductor device according to claim 1, wherein the seed crystal with a hexagonal structure including zinc is zinc oxide.

3. The method for manufacturing a semiconductor device according to claim 1, wherein the crystalline oxide semiconductor is formed while the substrate is heated at a temperature higher than or equal to 200° C. and lower than or equal to 400° C.

4. The method for manufacturing a semiconductor device according to claim 1, wherein the crystal included in the seed crystal or the crystal included in the crystalline oxide semiconductor film has a c-axis which is substantially perpendicular to a plan surface of the substrate.

5. The method for manufacturing a semiconductor device according to claim 1, wherein a temperature of the heat treatment is a temperature at which hydrogen included in the crystalline oxide semiconductor film is released.

6. A method for manufacturing a semiconductor device, comprising the steps of:
    forming a gate electrode over a substrate;
    forming a gate insulating film comprising an oxide insulating film over the gate electrode;
    forming a seed crystal with a hexagonal crystal structure including zinc by a sputtering method over the gate insulating film;
    causing a crystal growth using the seed crystal as a nucleus while depositing indium over the seed crystal to form a crystalline oxide semiconductor film having a hexagonal crystal structure;
    performing a heat treatment on the crystalline oxide semiconductor film;
    etching the crystalline oxide semiconductor film after the heat treatment;
    forming a pair of electrodes over the crystalline oxide semiconductor film after the etching step; and
    forming an insulating film over the pair of electrodes.

7. The method for manufacturing a semiconductor device according to claim 6, wherein the seed crystal with a hexagonal structure including zinc is zinc oxide.

8. The method for manufacturing a semiconductor device according to claim 6, wherein the crystalline oxide semiconductor is formed while the substrate is heated at a temperature higher than or equal to 200° C. and lower than or equal to 400° C.

9. The method for manufacturing a semiconductor device according to claim 6, wherein the crystal included in the seed crystal or the crystal included in the crystalline oxide semiconductor film has a c-axis which is substantially perpendicular to a plan surface of the substrate.

10. The method for manufacturing a semiconductor device according to claim 6, wherein a temperature of the heat treatment is a temperature at which hydrogen included in the crystalline oxide semiconductor film is released.

* * * * *